(12) United States Patent
Wegener

(10) Patent No.: US 9,047,118 B2
(45) Date of Patent: Jun. 2, 2015

(54) COMPUTATIONALLY EFFICIENT COMPRESSION OF FLOATING-POINT DATA

(75) Inventor: Albert W. Wegener, Aptos Hills, CA (US)

(73) Assignee: Altera Corporation, San Jose, CA (US)

(*) Notice: Subject to any disclaimer, the term of this patent is extended or adjusted under 35 U.S.C. 154(b) by 384 days.

(21) Appl. No.: 13/534,330

(22) Filed: Jun. 27, 2012

(65) Prior Publication Data

US 2013/0007076 A1 Jan. 3, 2013

Related U.S. Application Data

(60) Provisional application No. 61/503,981, filed on Jul. 1, 2011, provisional application No. 61/503,232, filed on Jun. 30, 2011.

(51) Int. Cl.
| | | |
|---|---|---|
| G06F 7/00 | (2006.01) | |
| G06F 7/483 | (2006.01) | |
| H03M 7/30 | (2006.01) | |
| G06T 9/00 | (2006.01) | |

(52) U.S. Cl.
CPC ............ G06F 7/483 (2013.01); *G06T 9/005* (2013.01); H03M 7/30 (2013.01)

(58) Field of Classification Search
CPC ....... H03M 7/30; H04N 7/26106; H04N 7/50; H04N 7/30; G06T 9/005
USPC ........................................................ 708/203
See application file for complete search history.

(56) References Cited

U.S. PATENT DOCUMENTS

| | | |
|---|---|---|
| 5,839,100 A | 11/1998 | Wegener |
| 6,240,431 B1 | 5/2001 | Dyer et al. |
| 6,253,222 B1 | 6/2001 | Dyer et al. |
| 6,396,420 B1 | 5/2002 | Augustine |
| 6,631,392 B1 | 10/2003 | Jiang et al. |
| 6,701,427 B1 | 3/2004 | Hinds et al. |
| 7,126,501 B2 | 10/2006 | Moriya et al. |
| 7,209,056 B2 | 4/2007 | Moriya et al. |
| 7,230,551 B2 | 6/2007 | Moriya et al. |

(Continued)

OTHER PUBLICATIONS

Burtscher Martin, et al., "FPC: A High-Speed Compressor for Double-Precision Floating-Point Data," IEEE Transactions on Computers, vol. 58, No. 1, Jan. 2009, 14 pages.

(Continued)

*Primary Examiner* — Tan V. Mai
(74) *Attorney, Agent, or Firm* — Okamoto & Benedicto LLP

(57) ABSTRACT

Compression of floating-point numbers is realized by comparing the exponents of the floating-point numbers to one or more exponent thresholds to classify the floating-point numbers and to apply different compression types to the different classes. Each class and compression type is associated with an indicator. An indicator array contains M indicators for M floating-point numbers. The position of the indicator in the indicator array corresponds to one of the floating-point numbers and the indicator value specifies the class and compression type. The floating-point number is encoded in accordance with the compression type for its class. A compressed data packet contains the indicator array and up to M encoded floating-point numbers. Decompression extracts the indicator array and the encoded floating-point numbers from the compressed data packet and decodes the encoded floating-point numbers in accordance with the compression type associated with the indicator value to form a reconstructed floating-point number.

30 Claims, 26 Drawing Sheets

(56) References Cited

U.S. PATENT DOCUMENTS

| | | | |
|---|---|---|---|
| 7,554,464 | B1 | 6/2009 | Oberdorfer |
| 2007/0061388 | A1 | 3/2007 | Carlough et al. |
| 2007/0208792 | A1 | 9/2007 | Berjon et al. |
| 2011/0078222 | A1 | 3/2011 | Wegener |
| 2011/0099295 | A1 | 4/2011 | Wegener |
| 2012/0166510 | A1 | 6/2012 | Chen et al. |
| 2013/0124589 | A1* | 5/2013 | Deslandes .................. 708/203 |

OTHER PUBLICATIONS

Fulscher, Markus et al., "An Electron Repulsion Integral Compression Algorithm," J. of Computational Chem., vol. 14, No. 1, Jan. 1993, pp. 8-12.

Gamito, Manuel N., et al. "Lossless Coding of Floating Point Data with JPEG 2000 Part 10," Applications of Digital Image Processing Conference XXVII, vol. 5558, Aug. 2004, 12 pages.

Katahira, Kazuya et al. "FPGA-based Lossless Compressors of Floating-Point Data Streams to Enhance Memory Bandwidth," IEEE ASAP Conference, Jul. 2010, 8 pages.

Lindstrom, Peter et al. "Fast and Efficient Compression of Floating-Point Data," IEEE Trans. on Visualization and Computer Graphics, vol. 12, No. 5, Sep. 2006, 6 pages.

Stradella, Omar G., et al. "Techniques for the Compression of Sequences of Integer Numbers for Real Numbers with Fixed Absolute Precision," Journal of Computational Chemistry, vol. 14, No. 6, Jun. 1993, 673-679.

Tomari, Hisanoubu et al., "Compressing Floating-Point Number Stream for Numerical Applications," Proceedings 2010 First International Conference on Networking and Computing (ICNC 2010), IEEE Computer Society, pp. 112-119, Nov. 2010.

Wegener, Albert W., "Compression of Floating-Point Data in Encoding Groups," U.S. Appl. No. 13/534,552, filed Jun. 27, 2012, 79 pages.

Wegener, Albert W., "Compression of Floating-Point Data," U.S. Appl. No. 13/534,389, filed Jun. 27, 2012, 79 pages.

Zhou, Tong et al. "An entropy coding method for floating-point texture coordinates of 3D mesh," Proc. of 2010 IEEE Int'l Symp. on Circuits and Systems (ISCAS), May/Jun. 2010, 4 pages.

International Search Report and Written Opinion from PCT/US2012/044424 mailed Dec. 20, 2012, 10 pages.

* cited by examiner

Table 1

| Exponent Difference | Exponent Token | Token Length |
|---|---|---|
| 0 | 0 | 1 |
| +1 | 100 | 3 |
| -1 | 101 | 3 |
| +2 | 1100 | 4 |
| -2 | 1101 | 4 |
| +3 | 1110 | 4 |
| -3 | 11110 | 5 |
| All Others | 11111 (ESC) | 5 + NE |

Table 2

| Exponent Difference | Exponent Token | Token Length |
|---|---|---|
| 0 | 000 | 3 |
| +1 | 001 | 3 |
| -1 | 010 | 3 |
| +2 | 011 | 3 |
| -2 | 100 | 3 |
| +3 | 101 | 3 |
| -3 | 110 | 3 |
| All Others | 111 (ESC) | 3 + NE |

Table 3

| Exponent Difference | Exponent Token | Token Length |
|---|---|---|
| 0 | 00 | 2 |
| +1 | 010 | 3 |
| -1 | 011 | 3 |
| +2 | 100 | 3 |
| -2 | 101 | 3 |
| +3 | 1100 | 4 |
| -3 | 1101 | 4 |
| All Others | 111 (ESC) | 3 + NE |

Figure 21

Table 4

| Max. Exponent Difference | Exponent Token | Token Length |
|---|---|---|
| 0 | 00 | 2 |
| -1 | 010 | 3 |
| +1 | 011 | 3 |
| -2 | 100 | 3 |
| +2 | 101 | 3 |
| All Others | 11 (ESC) | 2 + NE |

Table 2

| Max Exponent Difference | Exponent Token | Token Length |
|---|---|---|
| 0 | 00 | 2 |
| -1 | 010 | 3 |
| +1 | 011 | 3 |
| -2 | 100 | 3 |
| +2 | 101 | 3 |
| -3 | 1100 | 4 |
| +3 | 1101 | 4 |
| All Others | 111 (ESC) | 3 + NE |

Table 3

| Max. Exponent Difference | Exponent Token | Token Length |
|---|---|---|
| 0 | 00 | 2 |
| -1 | 010 | 3 |
| +1 | 011 | 3 |
| -2 | 100 | 3 |
| +2 | 101 | 3 |
| -3 | 1100 | 4 |
| +3 | 1101 | 4 |
| -4 | 11100 | 5 |
| +4 | 11101 | 5 |
| All Others | 1111 (ESC) | 4 + NE |

Figure 26

COMPUTATIONALLY EFFICIENT COMPRESSION OF FLOATING-POINT DATA

RELATED APPLICATIONS

This application claims benefit of U.S. Provisional Patent Application No. 61/503,981 filed on 1 Jul. 2011, entitled "Compression of Floating-Point Data," and also claims the benefit of U.S. Provisional Patent Application No. 61/503,232 filed on 30 Jun. 2011, entitled "Compression of Floating-Point Data."

BACKGROUND

The technology described herein relates to compression of data represented in a floating-point format for efficient storage and transfer in a computing system.

In present high performance computing applications, it is often necessary to transfer vast amounts of floating-point data among multiple processor cores or between processor cores and memory. The limited data transfer rates of interfaces among processor cores and between cores and memory devices can create bottlenecks for overall data processing speed and performance. In data rich applications, storage of floating-point data challenges memory resources and storage devices. Reducing the demands on data transfer and storage capacity for floating-point data can improve the efficiency, economy and performance of the computing system. Compression of the floating-point data may reduce these demands, however at the cost of additional computations. In applications having vast quantities of floating-point data, it is especially important that the compression be computationally efficient in order to minimize demands on computing resources.

Commonly owned patents and applications describe a variety of compression techniques applicable to fixed-point, or integer, representations of numerical data or signal samples. These include U.S. Pat. No. 5,839,100 (the '100 patent), entitled "Lossless and loss-limited Compression of Sampled Data Signals" by Wegener, issued Nov. 17, 1998, and the U.S. patent application Ser. No. 12/605,245 (the '245 application), entitled "Block Floating Point Compression of Signal Data," publication number 2011-0099295, published Apr. 28, 2011. The commonly owned patent application Ser. No. 12/891,312 (the '312 application), entitled "Enhanced Multi-processor Waveform Data Exchange Using Compression and Decompression," by Wegener, publication number 2011-0078222, published Mar. 31, 2011, incorporated by reference herein, describes configurable compression and decompression for fixed-point or floating-point data types in computing systems having multi-core processors. In a multi-core processing environment, input, intermediate, and output waveform data are often exchanged among cores and between cores and memory devices. The '312 application describes a configurable compressor/decompressor at each core that can compress/decompress integer or floating-point waveform data. The '312 application describes configurable compression/decompression at the memory controller to compress/decompress integer or floating-point waveform data for transfer to/from off-chip memory in compressed packets. The configurable compressor and decompressor of the '312 application may be configured to apply the floating-point compression and decompression described in the present application.

FIG. 1 is a diagram illustrating an example of a floating-point data format used in a computing system. This floating-point format is presented for illustrative purposes only. The compression and decompression described herein are not limited to this particular representation of floating-point data. In FIG. 1, the floating-point format represents a floating-point number 10 by an array of binary bits. The floating-point number 10 occupies a number of bits NB that include a single sign bit 12, the number of bits NE representing an exponent 14 and the number of bits NM representing a mantissa 16, also referred to as a significand. The sign bit 12 has a value of s=0 for positive numbers and s=1 for negative numbers. The numbers of bits NB, NE and NM may be specified by the floating-point format. For example, the IEEE-754 Standard for Floating-Point Arithmetic, referred to as "IEEE-754 standard", defines single precision and double precision floating-point formats. For single precision, the number of bits NB=32, the number of exponent bits NE=8 and the number of mantissa bits NM=23. To construct a single precision floating-point number from a fixed-point binary number, the leading "1" of the binary fixed-point number is shifted to the left of the binary point and the fractional part is stored in NM bits of the floating-point mantissa 16. The leading "1" is not stored in the floating-point mantissa 16. In order to store only positive values for the floating-point exponent 14, an exponent bias of 127 is added to the value of the exponent. The value of the single precision floating-point number in sign and magnitude notation is given by, $$(-1)^s \times 1 \cdot m \times 2^{(e-e0)} \quad (1)$$

where s is the value of the sign bit 12, m is the binary value of the mantissa 16, e is the binary value of the exponent 14 and e0=127, the exponent bias for single precision. For e0=127, the exponent term (e−e0) in equation (1) can be any value in the range of −127≤(e−e0)≤128. For double precision floating-point format, the IEEE-754 standard specifies the number of bits NB=64, the number of exponent bits NE=11, the number of mantissa bits NM=52 and the exponent bias e0=1023. In equation (1), the "1·m" term contains a "1" before the binary point that is not explicitly encoded in the mantissa "m", but is implicit in the floating-point format. The implicit "1" is referred to as the "hidden bit".

In order to better meet the requirements of higher speed data transfer, reduced memory utilization and minimal computation in many computing applications, a need exists for computationally efficient compression and decompression of floating-point data.

SUMMARY

Computationally efficient compression of floating-point numbers can provide for efficient data transfer and memory utilization. Compression of floating-point numbers is realized by comparing the exponents of the floating-point numbers to one or more exponent thresholds in order to classify the floating-point numbers and to apply different compression types to the different classes. Each class and compression type is associated with an indicator. An indicator array for M indicators is maintained for the M floating-point numbers. The position of the indicator in the indicator array corresponds to one of the floating-point numbers and the indicator value specifies the class and the compression type for the floating-point number. The floating-point number is encoded in accordance with the compression type for its class, as indicated by the indicator value, to provide an encoded floating-point number. A compressed data packet contains the indicator array and up to M encoded floating-point numbers.

Decompression of the compressed data packet is realized by reconstructing floating-point numbers from encoded floating-point numbers from the compressed data packet. The indicator array is extracted from the compressed data packet.

The M indicators of the indicator array correspond to encoded floating-point numbers contained in the compressed data packet, where the position of the indicator in the indicator array corresponds to an encoded floating-point number and the indicator value specifies a compression type. The encoded floating-point numbers corresponding to the indicators are extracted from the compressed data packet. The encoded floating-point numbers are decoded in accordance with the compression type associated with the indicator value to form a reconstructed floating-point number having the original number of bits in accordance with the floating-point format.

BRIEF DESCRIPTION OF THE DRAWINGS

FIG. 21 gives examples of code tables for the exponent differences.

FIG. 26 gives examples of code tables for the maximum exponent differences, maxexp_diff(j).

DETAILED DESCRIPTION

Embodiments of the compression and decompression described herein may encompass a variety of computing architectures that represent digital data using a floating-point format, referred to herein as floating-point data, floating-point numbers and floating-point samples. The floating-point data may be generated by a variety of applications and the computing architectures may be general purpose or specialized for particular applications. The digital data may result from detected data from a physical process, a data created by computed simulation or intermediate values of data processing. For example, the digital data may arise from analog sensor signals that are converted by an analog to digital converter (ADC) to a digital signal whose sample values are represented in a floating-point format. For another example, the digital data may be spatial data points for a simulated computer graphics image.

Figure 2:
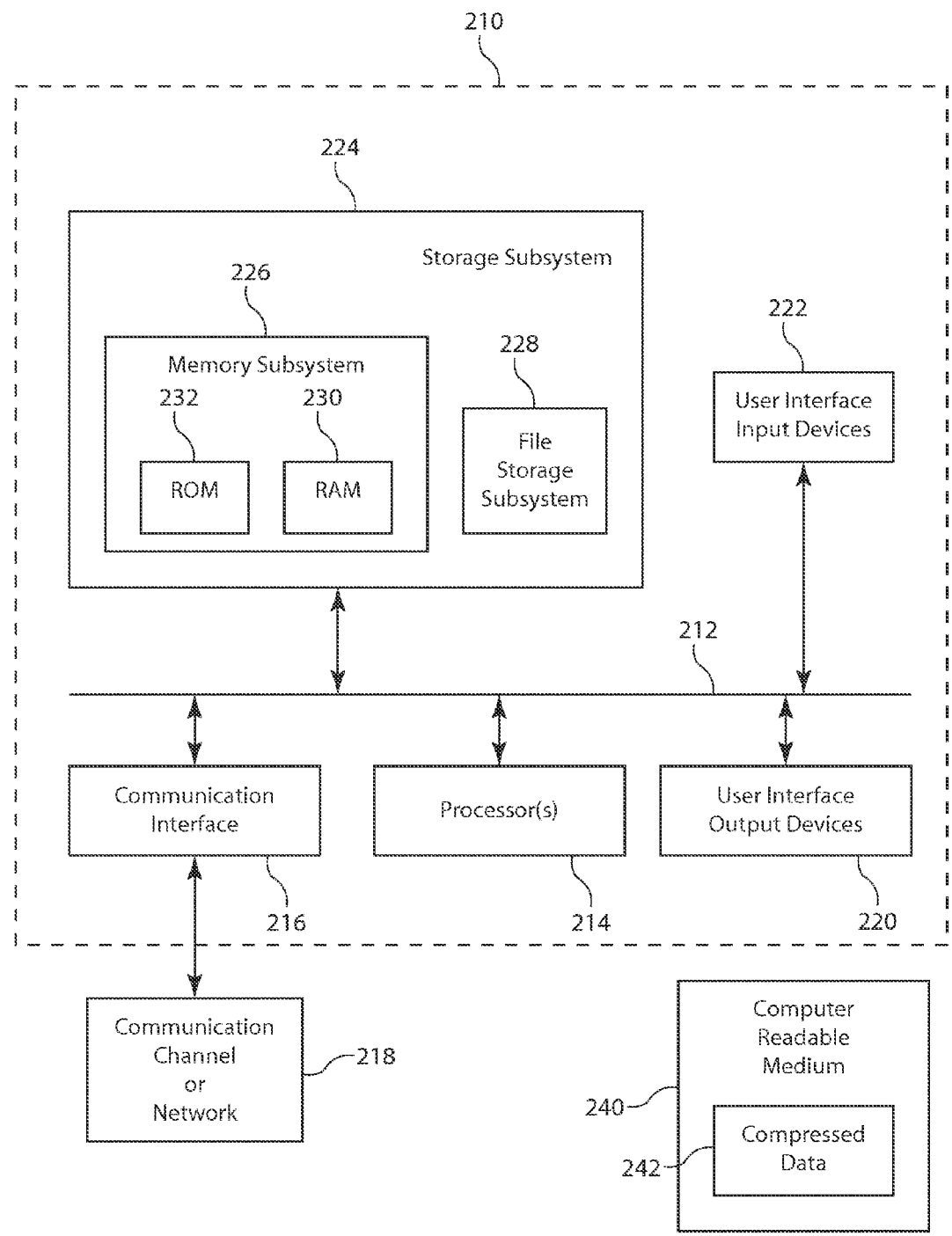
FIG. 2 is a block diagram of a computer system suitable for use with embodiments of the compression and decompression of floating-point data.

FIG. 2 is a block diagram of a computer system suitable for use with embodiments of the compression and decompression of floating-point data. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a communication interface subsystem 216. The input and output devices allow user interaction with computer system 210. Communication interface subsystem 216 provides an interface to communication channel or network 218, which may be a single channel or a communication network having multiple channels. The communication channel or network 218 is coupled to corresponding interface devices in other computer systems, transmitting or receiving devices, or an outside network. The communication channel or network 218 may comprise wireline links, optical links, wireless links, or any other mechanisms for communication of information. The communication network 218 may comprise many interconnected computer systems and communication links. While in one embodiment, communication network 218 is the Internet, in other embodiments, the communication network 218 may be any suitable computer network.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display, such as via audio output devices. In general, use of the term "output device" is intended to include all possible types of devices and ways to output information from computer system 210 to the user or to another machine or computer system.

Storage subsystem 224 stores the basic programming and data constructs that may provide some or all of the functions for the floating-point compression and/or the decompression described herein. These software modules are generally executed by processor 214. The processor(s) 214 may include one or more of a DSP, microprocessor, microcontroller, CPU or GPU. The processor(s) 214 may also include dedicated application specific integrated circuit (ASIC) or field-programmable gate array (FPGA) logic implementing some or all of the floating-point compression and/or decompression functionality.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer readable medium 240 can be a medium associated with file storage subsystem 228, and/or with communication interface subsystem 216. The computer readable medium 240 can be a hard disk, a floppy disk, a CD-ROM, an optical medium, removable media cartridge, or electromagnetic wave. The computer readable medium 240 is shown storing a compressed data file 242. The computer readable medium may also store programs implementing the functions of floating-point compression and/or decompression.

Computer system 210 itself can be of varying types including a personal computer, a portable computer, a workstation, a computer terminal, a network computer, a mainframe, a television, a smart phone, a tablet computer or any other data processing system or user device. Due to the ever-changing nature of computers and networks, the description of computer system 210 depicted in FIG. 2 is intended only as a specific example for purposes of illustrating the preferred embodiments. Many other configurations of computer system 210 are possible having more or fewer components than the computer system depicted in FIG. 2.

Figure 3:
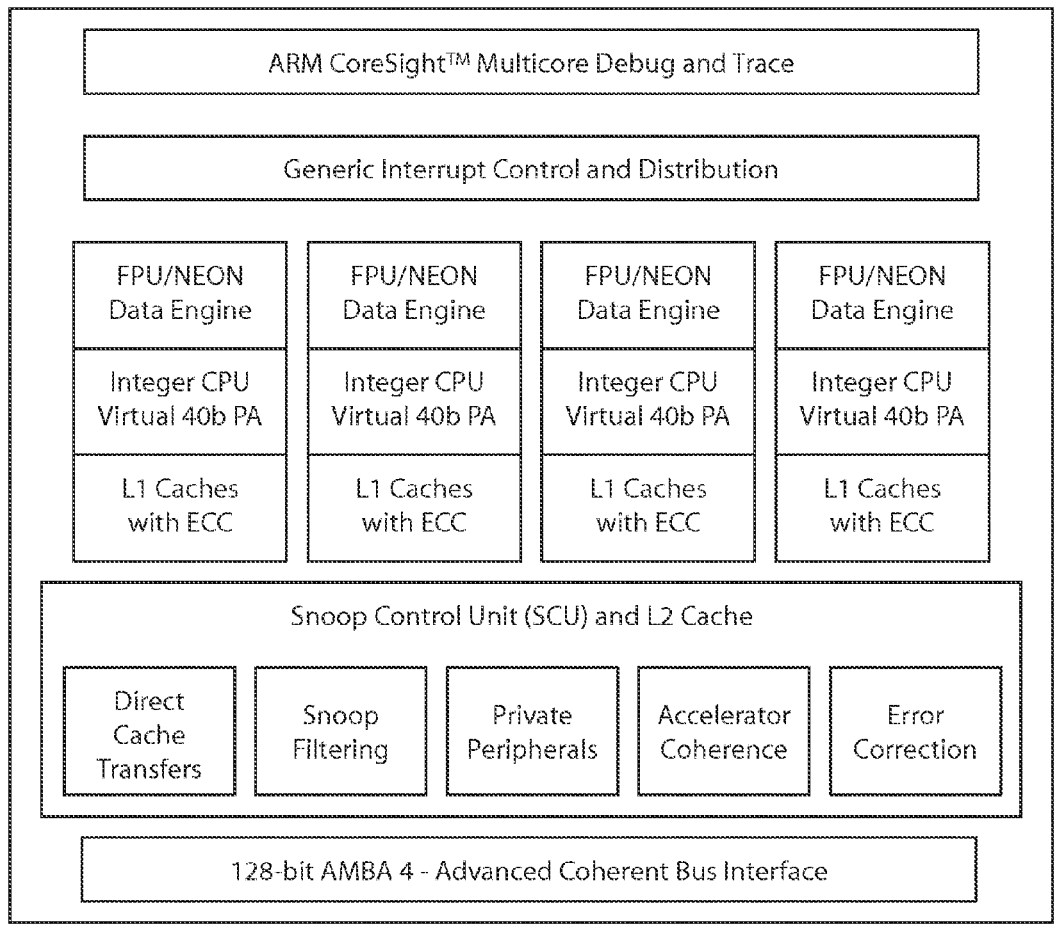
FIG. 3 illustrates a block diagram of a four-core ARM Cortex-A15 processor for use with embodiments of the compression and decompression of floating-point data.
Figure 4:
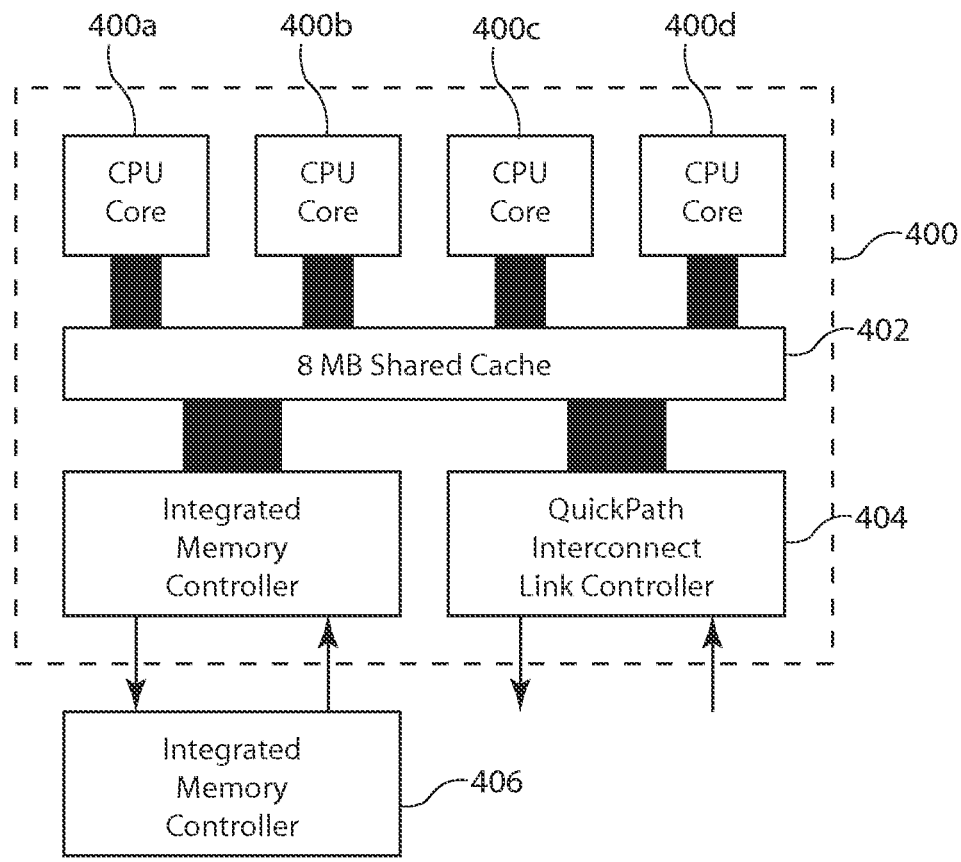
FIG. 4 illustrates the Intel Nehalem CPU architecture for use with embodiments of the compression and decompression of floating-point data.
Figure 5:
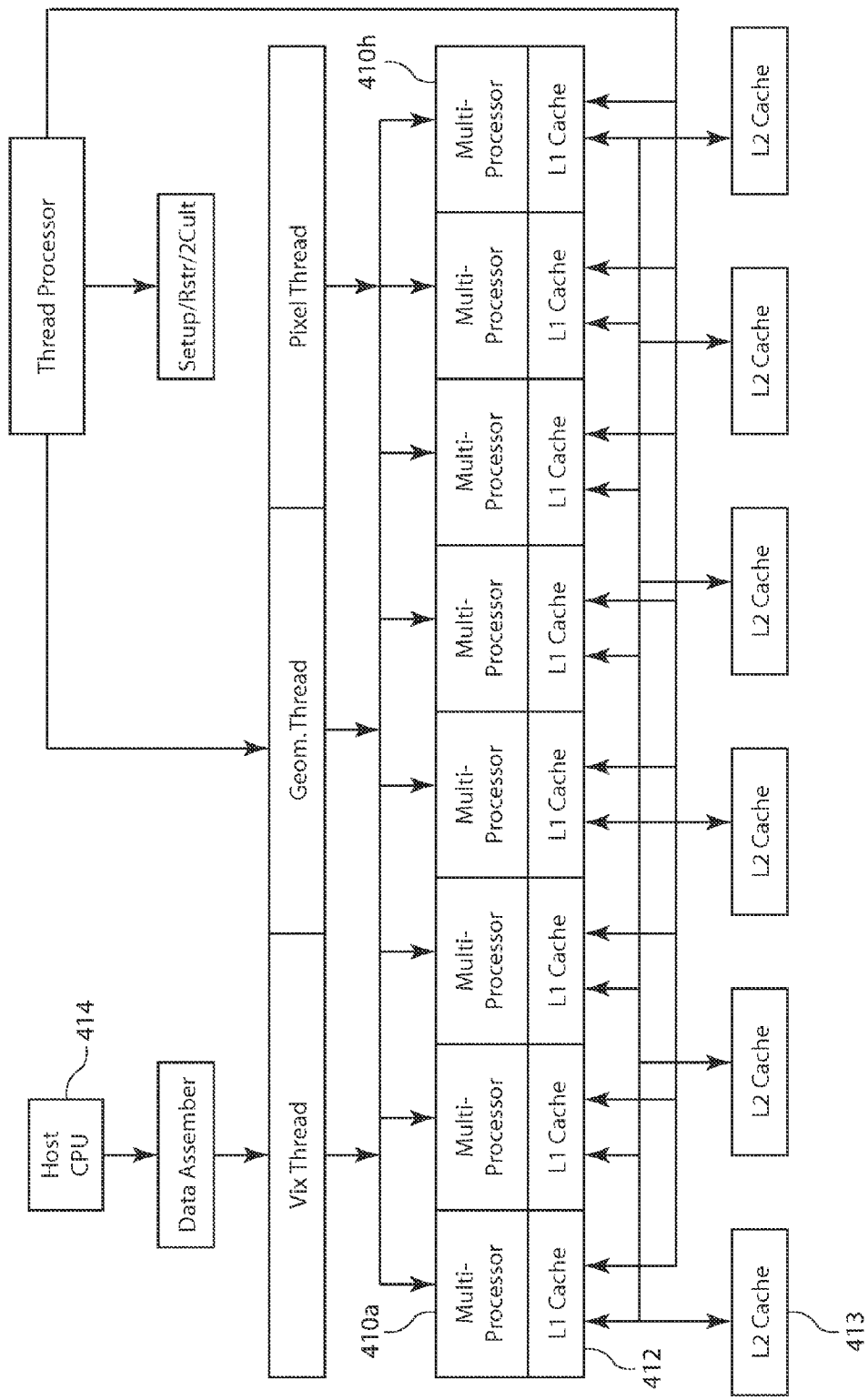
FIG. 5 illustrates the Nvidia GeForce 8800 GPU architecture for use with embodiments of the compression and decompression of floating-point data.

FIGS. 3, 4 and 5 illustrate examples of data processing devices having multiple processor cores suitable for embodiments of floating-point compression and decompression. For example, a multiple processor core device may comprise the processor(s) 214 of the computer system 210 of FIG. 2. For another example, a multiple core processor may be embedded in an application device, such as a mobile handset, smartphone, set-top box, medical imaging device, wireless communication infrastructure, and other compute-intensive instruments.

FIG. 3 illustrates a block diagram of a four-core Advanced RISC Machines (ARM) Cortex-A15 processor for use with embodiments of the compression and decompression of floating-point data. The A15 core, which ARM introduced in September 2010, is targeted for use in smart phones (one to two A15 cores), wireless base stations (two to four cores), and low-power servers (four to twelve cores). In FIG. 3, the four A15 cores share a Level 2 (L2) cache and connections to the 128-bit AMBA 4 bus. The AMBA 4 bus can connect at least 3 four-core A15 processors, thus allowing A15 users to instantiate as many as twelve A15 cores on a single silicon die. The ARM Cortex-A15 design will typically be fabricated in 32 nm or 28 nm CMOS processes. In FIG. 3, the block labeled "FPU/NEON Data Engine" (FPU=Floating Point Unit; NEON=ARM's Single Instruction, Multiple Data [SIMD] execution unit) could incorporate the floating-point compression and decompression functions described herein. The Snoop Control Unit (SCU) is an interface for the AMBA 4 bus. The SCU could include an additional block implementing the floating-point compression and decompression functions. Integer and floating-point data types are sent to, and received from, other A15 cores and from off-chip memories and busses, via the AMBA 4 bus interface. Data compression would add significant additional bandwidth to the AMBA 4 bus, or alternately, would allow AMBA 4 bus transfers to require significantly less power when compared to existing uncompressed transfers of floating-point and integer numbers.

FIG. 4 illustrates the Intel Nehalem CPU architecture for use with embodiments of the compression and decompression of floating-point data. The Intel Nehalem CPU 400 contains four processor cores 400a, 400b, 400c, and 400d on one die, with a shared cache 402 having a capacity of 8 MB. The processor cores 400a through 400d access other computer system peripherals through a pair of Quick Path Interconnect (QPI) interfaces 404. The QPI interfaces 404 use a packet-based communication protocol. Some versions of Intel CPUs also use one or more QPI interfaces 404 to communicate with other Intel CPUs also having one or more QPI interfaces 404. Compressed floating-point data may be transferred among CPU cores 400a-d, cache 402, memory 406, and QPI 404. A compressor can be integrated at each QPI interface 404 to compress data for the payloads of the QPI packets to be transmitted and to decompress the compressed data from the payloads of the received QPI packets. An off-chip input controller (not shown) for providing data for the Nehalem processor may compress the data to form compressed payload data for the QPI packets. A decompressor at the QPI interconnect link controller 404 decompresses the compressed payload data and provides the decompressed data as payload data for QPI packets for transfer to the CPU cores 400a-d. The CPU cores 400a-d may also implement compressors and decompressors for data transfers. The integrated memory controller may also include a compressor and a decompressor to compress waveform data provided to off-chip memory and decompress compressed waveform data retrieved from memory. These compressors and decompressors can apply floating-point compression and decompression described herein.

FIG. 5 illustrates the Nvidia GeForce 8800 GPU architecture for use with embodiments of the compression and decompression of floating-point data. The Nvidia GeForce 8800 GPU includes 64 processors grouped into 8 multi-processors 410a through 410h. Each multi-processor includes 8 cores. The multi-processors 410a through 410h utilize distributed Level 1 (L1) cache 412 and distributed Level 2 (L2) cache 413 to store input values, intermediate results, and output values, and to exchange such values between cores. The GeForce 8800 receives input data values and transmits output data values from and to a host CPU 414. For example, compression of floating-point data may be integrated into the host-to-GPU and GPU-to-host communications controller for the data assembler. Floating-point compression and decompression may also be integrated into a GPU memory controller (not shown in FIG. 5).

Figure 1:
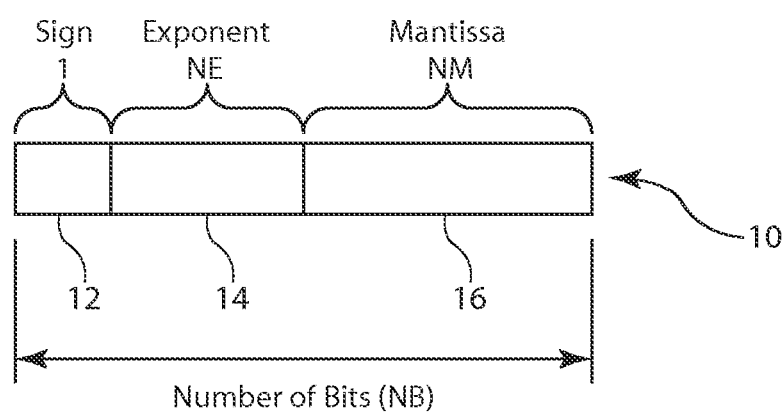
FIG. 1 is a diagram illustrating an example of a floating-point data format used in a computing system.
Figure 6:
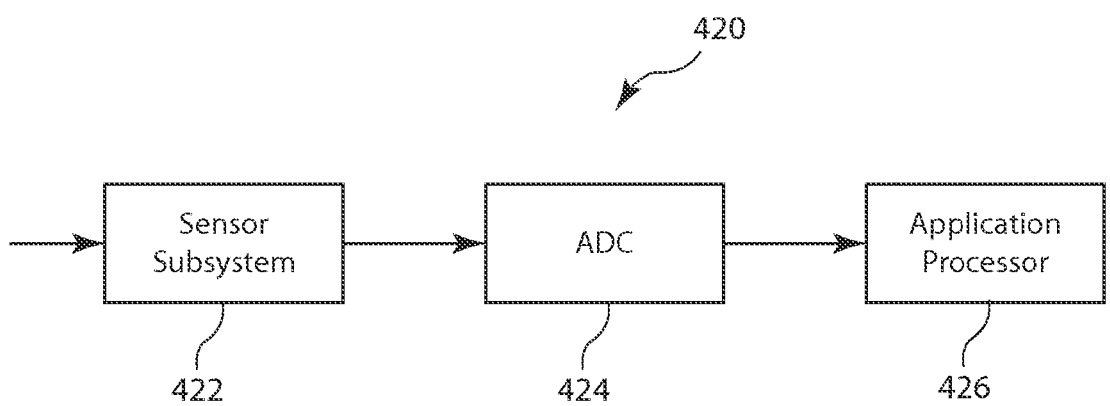
FIG. 6 is a block diagram of a sensor processing system for use with embodiments of the compression and decompression of floating-point data.

FIG. 6 is a block diagram of a sensor processing system for use with embodiments of the compression and decompression of floating-point data. A sensor subsystem 422 detects a physical signal of a particular modality and provides an analog signal representing the physical measurement to the ADC 424. Examples for the sensor subsystem 422 include an acoustic transducer, an x-ray detector, a radio antenna, a seismic sensor, or an array of sensors. The ADC 424 converts the analog signal to digital signal samples provided to the application processor 426. The application processor 426 may represent the signal samples as floating-point numbers, as shown in FIG. 1. The application processor may have a custom architecture for the application or an architecture as depicted in FIGS. 2 to 5. The application processor 426 may compress the floating-point data for a number of purposes, including storage in an internal memory or external storage device, transfer among processing units within the processor 426 or transfer to an external device for further processing, display, etc. Several alternative embodiments of floating-point compression and decompression are described in the following.

Figure 7:
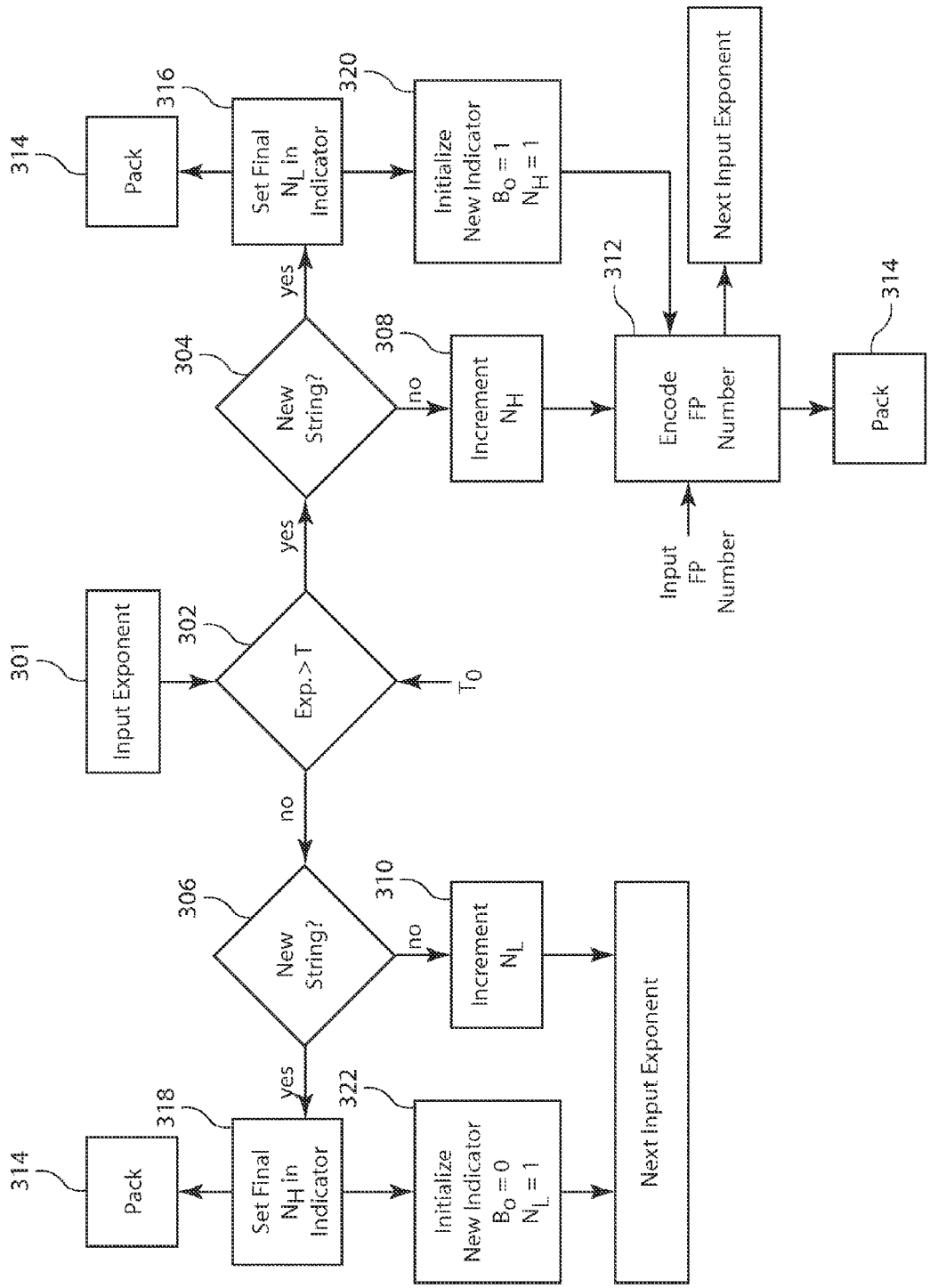
FIG. 7 is a block diagram floating-point compression in accordance with a first embodiment.
Figure 8:
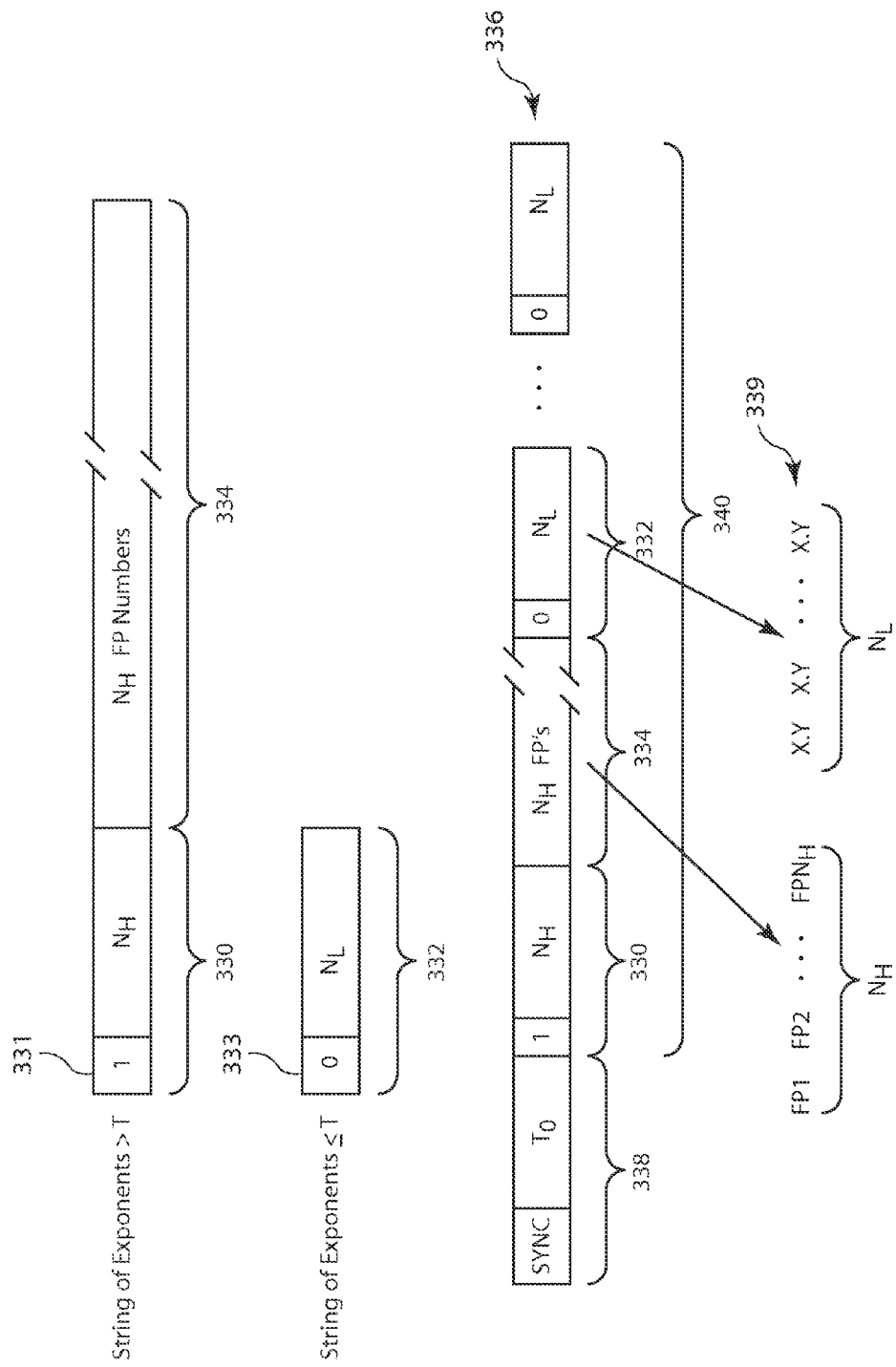
FIG. 8 shows a preferred structure of the indicator array.

FIG. 7 is a block diagram floating-point compression in accordance with a first embodiment. This embodiment is well suited for applications where the floating-point data are bursty such that there are strings of low or insignificant values interspersed with strings of higher, significant values. The exponent values of floating-point data are compared to a threshold to separate them into classes, or bins, and the type of compression applied depends on the class. For example, if the floating-point number is represented as in FIG. 1, the exponent 14 provides the input exponent 301. The input exponent 301 of a floating-point number is tested at comparison block 302 to determine if it is greater than a threshold $T_0$. The number $N_H$ keeps count of a string of consecutive input exponents 301 that are higher than the threshold $T_0$ and the number $N_L$ keeps count of a string of consecutive input exponents 301 that are lower than or equal to the threshold $T_0$. An indicator array stores the length and type of a string of consecutive input exponents for each class. FIG. 8 shows a preferred structure of the indicator array. For a string of consecutive exponents greater than $T_0$, the indicator array 330 includes an indicator bit 331 set to 1 followed by a bit field containing the value of $N_H$. For a string of consecutive exponents less than $T_0$, the indicator array 332 includes an indicator bit 333 set to 0 followed by a bit field containing the value of $N_L$. Returning to FIG. 7, the blocks 304 and 306 determine whether the current input exponent 301 starts a new string of consecutive exponents with respective values above or below/equal to the threshold $T_0$. If the current input exponent 301 does not start a new string, then blocks 308 and 310 increment the value of $N_H$ or $N_L$ respectively.

When the input exponent 301 is greater than $T_0$, the encoder 312 encodes the corresponding floating-point number. In a low computational complexity alternative, the encoder 312 may provide the floating-point number in its current format, such as that of FIG. 1, to the packetizer 314. In this alternative the compression bypasses encoding and saving of the floating-point data whose exponents are less than or equal to the threshold. In an alternative requiring more computation, the encoder 312 may further compress the floating-point numbers, as described below. The packetizer 314 concatenates the string of $N_H$ floating-point numbers with the indicator array 330. FIG. 8 shows the indicator array 330 followed by a bit field 334 containing the encoded $N_H$ floating-point numbers. When the input exponent is less than or equal to $T_0$, the corresponding low-valued floating-point numbers are not encoded. The number $N_L$ is saved in the indicator array 332, as shown in FIG. 8.

Returning to FIG. 7, when blocks 304 and 306 indicate that the current input exponent 301 starts a new string, blocks 316 and 318 set the final value of $N_L$ or $N_H$ corresponding to the previous string for the respective indicator array 330 or 332. The indicator array for the previous string is provided to the packetizer 314. Blocks 320 and 322 initialize a new indicator array for the new string that starts with the current input exponent 301. The respective indicator bit $B_0$ is set to 0 or 1 for the current string.

Referring to FIG. 8, the packetizer 314 forms a compressed data packet 336 having a header section 338 and a data section 340. For this example, the packetizer 314 stores indicator array 330, bit field 334 and indicator array 332 sequentially in the data section 340. The header section 338 includes a synchronization field for indicating sequence information of the packet 336 and a section for storing the threshold value $T_0$. Preferably, the indicator arrays 330 and 332 each have a defined length of one byte. This allows string lengths of up to 127, or a maximum value of 127 for $N_L$ and $N_H$. When the maximum length of a string is reached, a new indicator array is initiated for the next input exponent 301, as described above. Alternatively, the lengths of the indicator arrays 300 and 332 may be whole number multiples of bytes. Lengths in units of bytes are preferable because byte-level access is supportable by software and firmware instruction sets.

Figure 9:
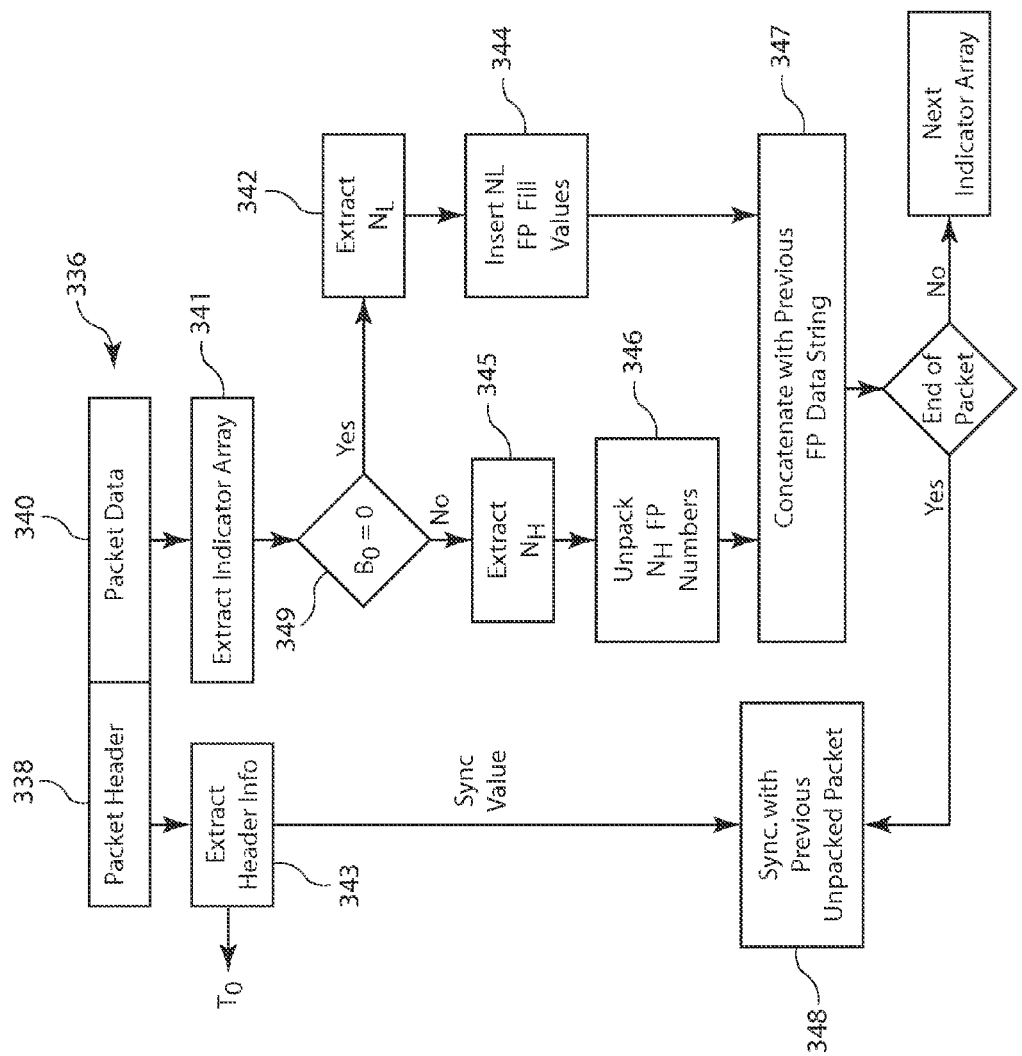
FIG. 9 is a block diagram of a decompressor in accordance with the first embodiment.

FIG. 9 is a block diagram of a decompressor in accordance with the first embodiment. Block 343 extracts the sync value and the threshold $T_0$ value from the header section 338 of the packet 336. Block 341 extracts the indicator array from the packet data section 340. Block 349 tests the value of the indicator bit $B_0$ from the indicator array. When $B_0=0$, block 342 determines the value of $N_L$ from the indicator array. Since the corresponding floating-point numbers were not stored in the data section 340 during compression, block 344 inserts $N_L$ fill values in the corresponding positions in the data string. For example, string of $N_L$ floating-point numbers equaling 0.0 may be generated. This is appropriate when values below the threshold $T_0$ are insignificant in the computations of the application. Other alternatives include inserting random floating-point numbers with values below the threshold $T_0$, an average value of the floating-point data below the threshold $T_0$ calculated during compression or other function appropriate for the application. When $B_0=1$, block 346 determines the value of $N_H$ from the indicator array. Block 346 unpacks the $N_H$ corresponding floating-point numbers from the data section 340 for corresponding positions in the data string. If the encoder 312 compressed the $N_H$ floating-point numbers, block 346 would unpack and decompress the compressed data. Block 347 concatenates the resulting string of floating-point numbers with a previous string reconstructed from the data section 340 until the end of the packet is reached. Referring to FIG. 8, the sequence 339 shows a string of $N_H$ unpacked floating-point numbers followed by a string of $N_L$ fill values "X.Y", which may be set to 0.0. Returning to FIG. 9, until the end of the packet is reached, the next indicator array is extracted to repeat the process at block 341. When the end of the packet 336 is reached, block 348 uses the sync value extracted from the heater section 338 to synchronize the current unpacked packet with the previous unpacked packet.

Figure 10:
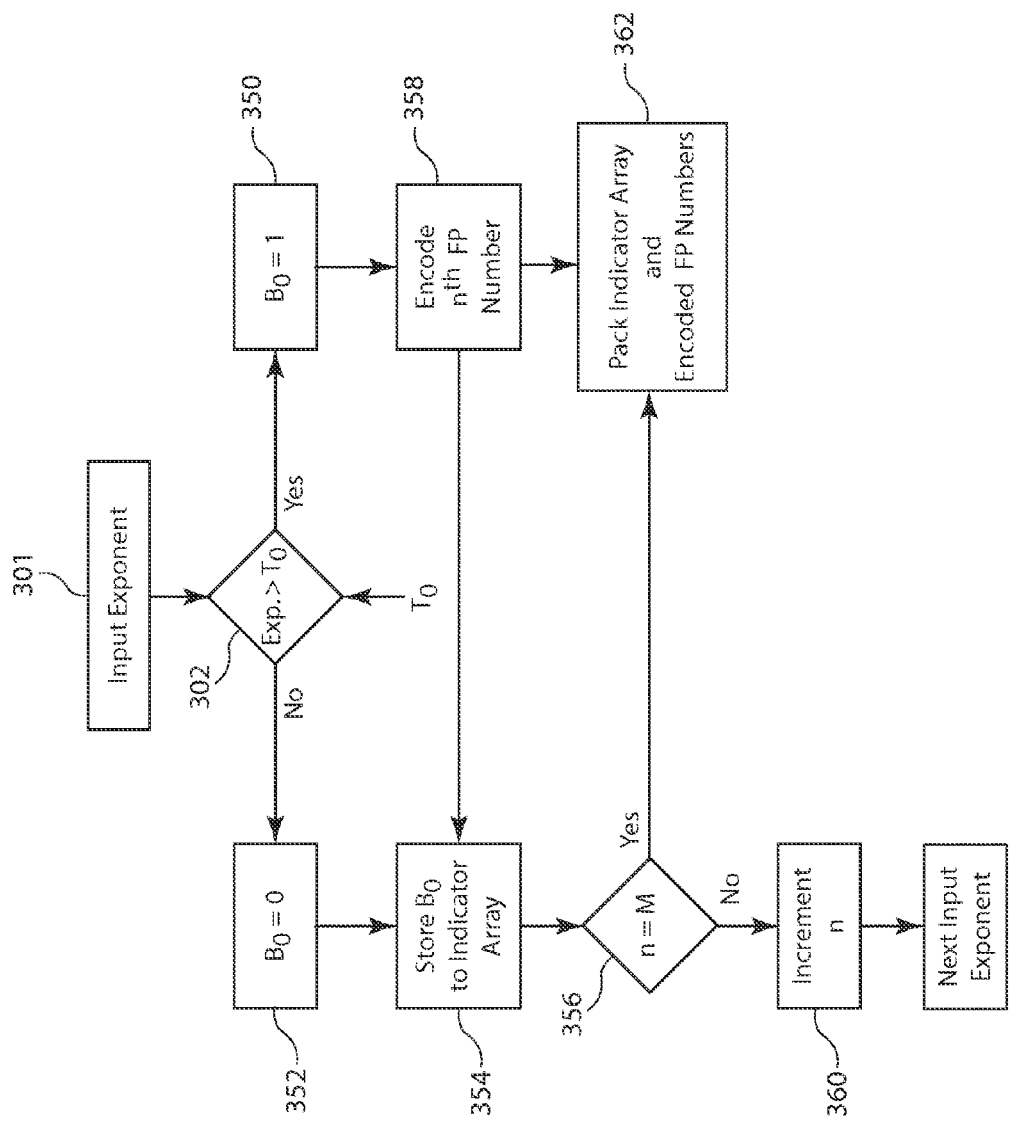
FIG. 10 is a block diagram of a second embodiment of floating-point compression.
Figure 11:
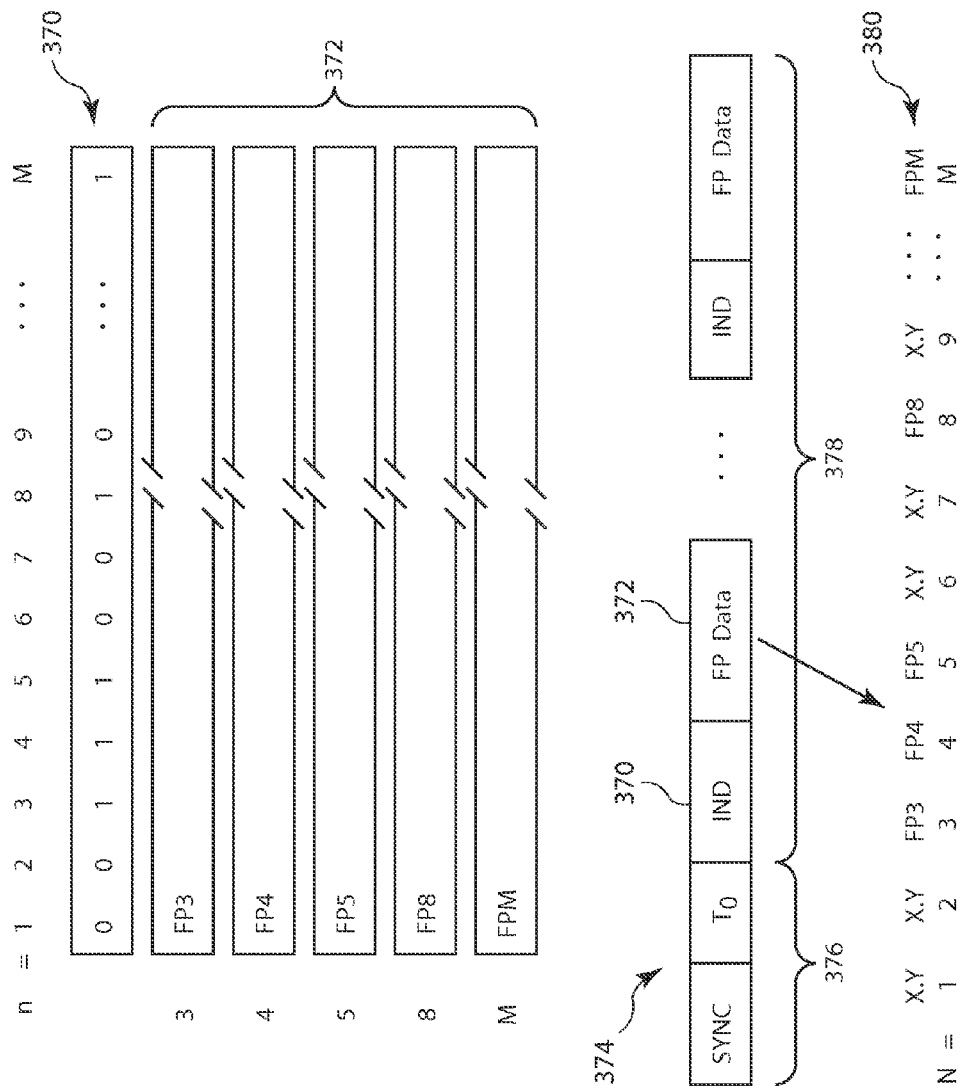
FIG. 11 illustrates an example of the packet structure for the second embodiment of floating-point compression.

FIG. 10 is a block diagram of a second embodiment of floating-point compression. This embodiment is preferred where the data have a large proportion of very low or insignificant values, but may not be bursty. The exponent values of floating-point data are compared to a threshold to separate into classes. An indicator $B_0$ is set for an indicator array that has a different structure than that of the first embodiment. Referring to FIG. 11, the indicator array 370 includes a number M of binary indicator bits $B_0$. Returning to FIG. 10, an $n^{th}$ floating-point exponent value 301 is compared to the threshold $T_0$ at comparison block 302. Blocks 352 and 350 set the corresponding indicator bit $B_0$ to 0 or 1 depending on the result. Block 354 stores the value of $B_0$ to the $n^{th}$ position of the indicator array 370. If the $n^{th}$ floating-point exponent is greater than the threshold $T_0$, the encoder 358 encodes the $n^{th}$ floating-point number. The encoder 358 may compress the floating-point number, as further described below. Alternatively, the encoder 358 may transfer the floating-point number in its current format, such as that of FIG. 1, to the packetizer 362. If the $n^{th}$ floating-point exponent is less than or equal to the threshold $T_0$, then the $n^{th}$ floating-point number is not encoded. Blocks 356 and 360 increment n until M floating-point numbers have been processed. The packetizer 362 stores the M indicator bits $B_0$ of the indicator array 370 and the corresponding encoded floating-point numbers in the data section 378 of a packet 374. If the number M is a multiple of 8, the indicator array 370 may be more easily managed by general-purpose CPUs and GPUs, since their instruction set includes instructions that directly operate on values that are multiples of 8 bits. Such convenient values of M include 8, 16, 32, or 64 bits per indicator array 370.

FIG. 11 illustrates an example of the packet structure for the second embodiment of floating-point compression. The indicator array 370 includes a single indicator bit $B_0$ for each of M floating-point numbers. The packetizer 362 packs the floating-point numbers or compressed floating-point numbers corresponding to indicator bits $B_0=1$ following the indicator array 370 in the data section 378 of the packet 374. In this example, those floating-point numbers corresponding to n=3, 4, 5, 8 and M, are saved as encoded floating-point data 372. The packetizer stores the synchronization information and the threshold value T in a header section 376. The data section 378 of the packet 374 contains at least one indicator array 370 and corresponding floating-point data 372.

Figure 12:
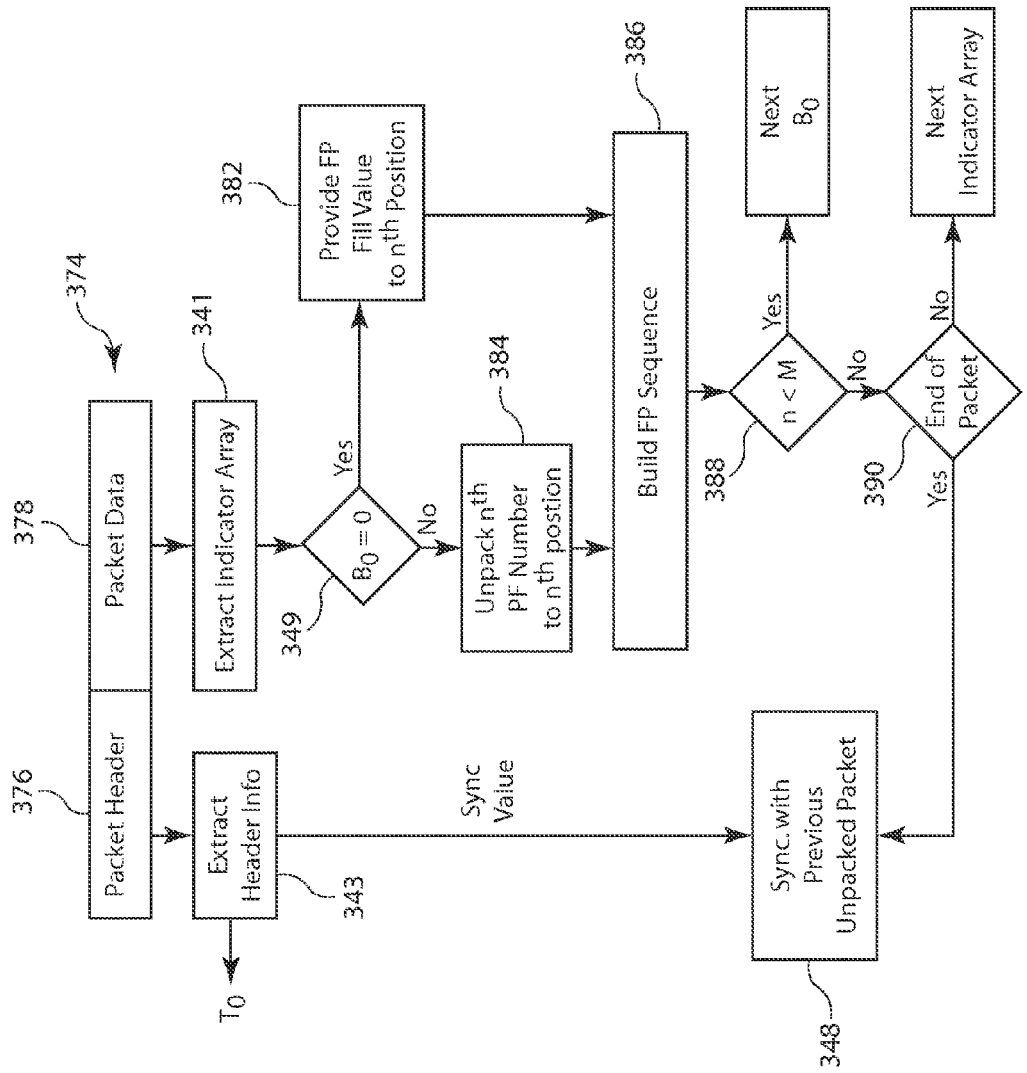
FIG. 12 is a block diagram of a decompressor in accordance with the second embodiment.

FIG. 12 is a block diagram of a decompressor in accordance with the second embodiment. Block 343 extracts the sync value and the threshold $T_0$ value from the header section 376 of the packet 374. Block 341 extracts the indicator array from the packet data section 378. Block 349 tests the value of the $n^{th}$ indicator bit $B_0$ from indicator array. When $B_0=0$, block 382 provides a floating-point fill value to the $n^{th}$ position of a reconstructed floating-point sequence. When $B_0=1$, block 384 decodes the corresponding floating-point number from the FP data 372 for the $n^{th}$ position of a reconstructed floating-point sequence. If the encoder block 358 compressed the floating-point number, block 384 would unpack and decompress the compressed floating-point number. Block 386 provides the indexing and buffers for building the floating-point sequence from the floating-point numbers provided by blocks 382 and 384. Block 388 determines whether the M indicator bits $B_0$ have been processed. If not, the next indicator bit $B_0$ from the indicator array is tested at block 349. Block 390 determines whether the end of the packet's data section 378 has been reached. If not, then the next indicator array 370 is extracted at block 341. If the end has been reached, then block 348 synchronizes the current sequence of reconstructed floating-point numbers produced at block 386 with previously reconstructed sequence of floating-point numbers.

Figure 13:
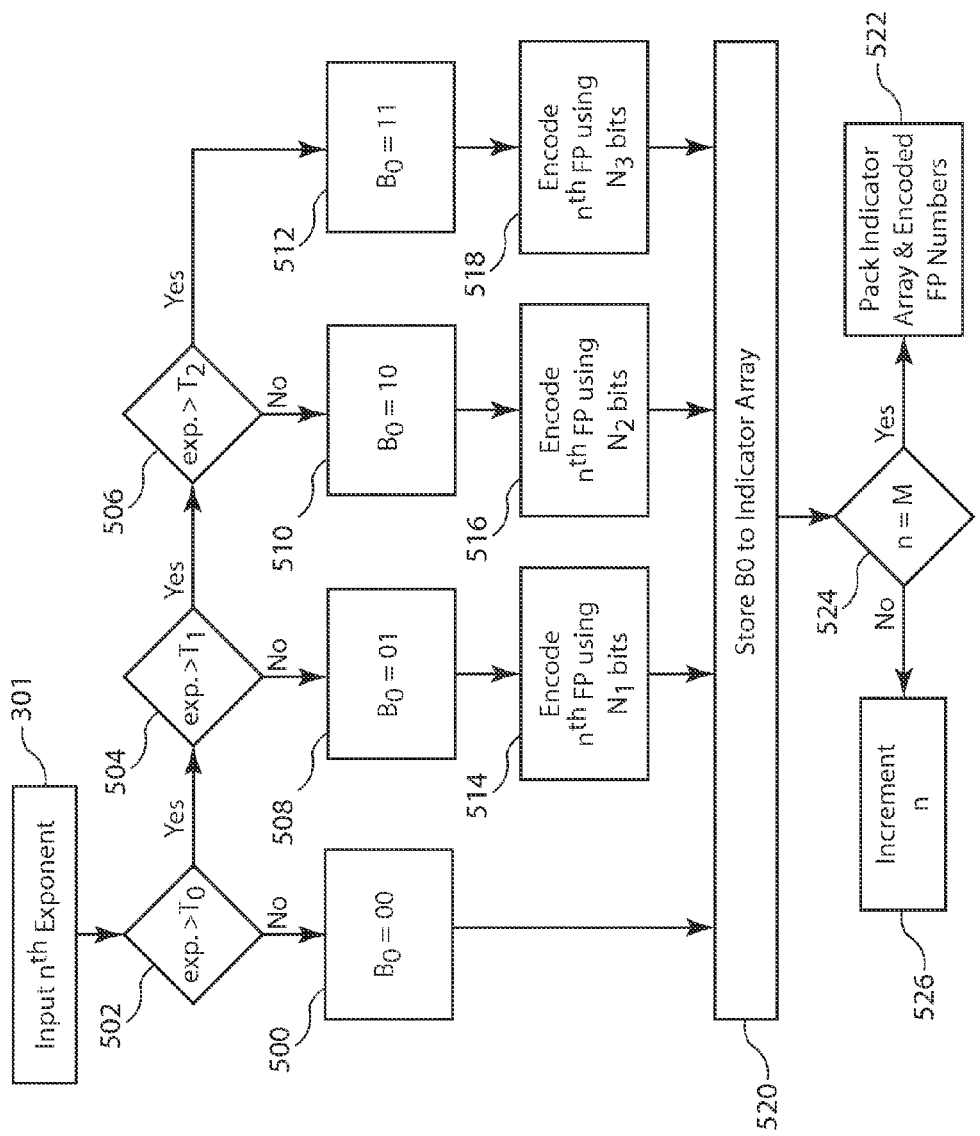
FIG. 13 is a block diagram in accordance with a third embodiment of floating-point compression.
Figure 14:
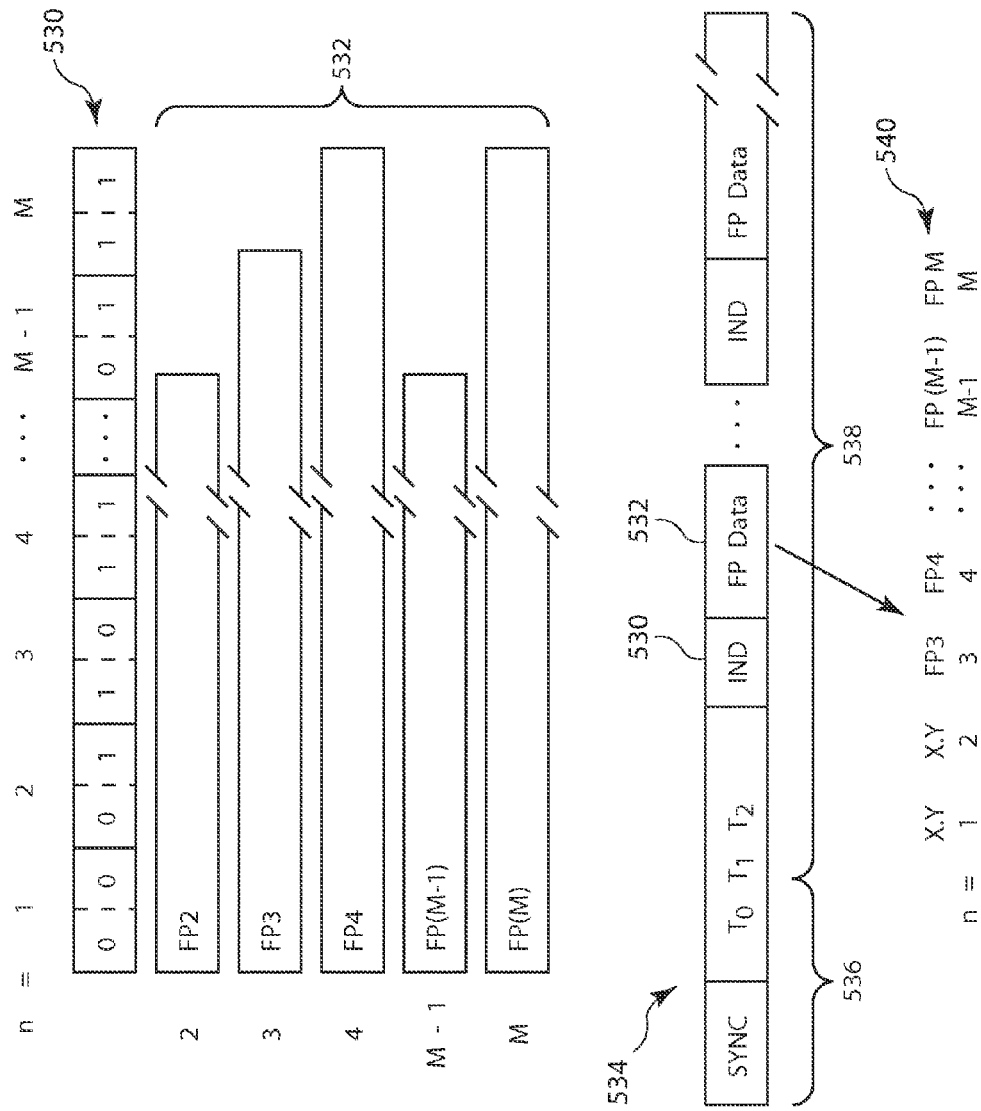
FIG. 14 illustrates an example of the packet structure for the third embodiment of floating-point compression.

FIG. 13 is a block diagram in accordance with a third embodiment of floating-point compression. In this embodiment, the input exponent is compared to multiple exponent thresholds and the type of compression applied is based on the result of the comparisons. The exponent thresholds provide boundaries for ranges of exponent values. The ranges of exponent values define respective classes for the input floating-point numbers. The class of the input floating-point number determines the compression type. For this example, four ranges of exponent values are bounded by three exponent thresholds, and the minimum and maximum exponent values supported by the floating-point format. A 2-bit indicator $B_0$ is associated with each exponent range, the corresponding class of floating-point numbers, and the compression type for the class. As shown in FIG. 14, the indicator array 530 for this example contains M 2-bit indicators $B_0$. Returning to FIG. 13, an $n^{th}$ input exponent may be compared to thresholds $T_0$, $T_1$, and $T_2$ at comparison blocks 502, 504 and 506, respectively, to determine the exponent range and the class of the corresponding floating-point number. Preferably the threshold values are set so that $T_0 < T_1 < T_2$. Blocks 500, 508, 510 and 512 assign a 2-bit indicator $B_0=00$, $B_0=01$, $B_0=10$ or $B_0=11$ to the respective classes based on the determined exponent range. For the lowest-valued class, when the exponent is below $T_0$, the floating-point number may not be encoded, as shown in this example. Alternatively, the floating-point number in the lowest-valued class may be encoded to $N_0$ bits, as described for the encoder blocks 514, 516 and 518. For the higher-valued classes, when the exponent is above $T_0$, the respective encoder block 514, 516 or 518 encodes the corresponding floating-point number using $N_1$, $N_2$ or $N_3$ bits. The encoder 518 corresponds to the highest-valued class having highest range of exponent values. The encoder 518 compresses the floating-point number to $N_3$ bits when $N_3$ is less than the original number of bits NB. Alternatively, the encoder 518 may keep the original number of bits for the floating-point number, where $N_3$ is equal to NB. Preferably, the lower-valued to higher-valued classes of floating-point numbers are encoded to progressively greater numbers of bits, where $0 \leq N_0 < N_1 < N_2 < N_3 \leq NB$. In one alternative compression type, the encoders 514 and 516 truncate the mantissas, but save the corresponding exponent bits and sign bit without compression. The sign bit, original exponent and compressed mantissa form the encoded floating-point number. For example, when the original number of bits NB=32, the numbers of bits corresponding to respective classes of floating-point numbers may be set to $N_1=16$, $N_2=24$ and $N_3=32$. For this example, the mantissa of a sample represented by $N_1=16$ bits is truncated from 23 bits to 7 bits and the mantissa of a sample represented by $N_2=24$ bits is truncated from 23 bits to 15 bits, while the one-bit sign and the original 8-bit exponent are left unchanged. Preferably, the numbers of bits $N_1$, $N_2$ or $N_3$ per encoded floating-point number are whole number multiples of eight, so the size of the encoded representation is a whole number multiple of bytes. Again, this preference for N1, N2, and N3 being a multiple of 8 bits reflects the availability of CPU and GPU instructions that conveniently process operands having 8, 16, 32, and 64 bits. Block 520 stores the 2-bit indicators $B_0$ to the indicator array 530 (FIG. 14). The packetizer 522 stores the M 2-bit indicators $B_0$ of the indicator array 530 and the corresponding encoded floating-point numbers in the data section 538 of a packet 534. Blocks 524 and 526 increment n until M floating-point numbers have been processed to complete the indicator array 530. The packetizer 522 packs the indicator array 530 and corresponding encoded floating-point numbers.

FIG. 14 illustrates an example of the packet structure for the third embodiment of floating-point compression. The indicator array 530 includes a 2-bit indicator $B_0$ for each of M floating-point numbers. The packetizer 522 packs the encoded floating-point numbers following the indicator array 530 in the data section 538 of the packet 534. In this example, the locations of the 2-bit indicators $B_0=01$, $B_0=10$ and $B_0=11$ in array 530 indicate that the encoded floating-point numbers 532 correspond to positions n=2, 3, 4, M−1 and M. The values of the 2-bit indicators correspond to the compression applied to the floating-point number. When the indicator $B_0$=01, the corresponding floating-point number is encoded using $N_1$ bits. When the indicator $B_0$=10, the corresponding floating-point number is encoded using $N_2$ bits. When the indicator $B_0$=11, the corresponding floating-point number is encoded using $N_3$ bits. When the indicator $B_0$=00, the corresponding floating-point number is not encoded in this example. The packetizer 522 stores the synchronization information and the threshold values $T_0$, $T_1$, and $T_2$ in a header section 536. The data section 538 contains at least one indicator array 530 and the corresponding floating-point data 532.

Figure 15:
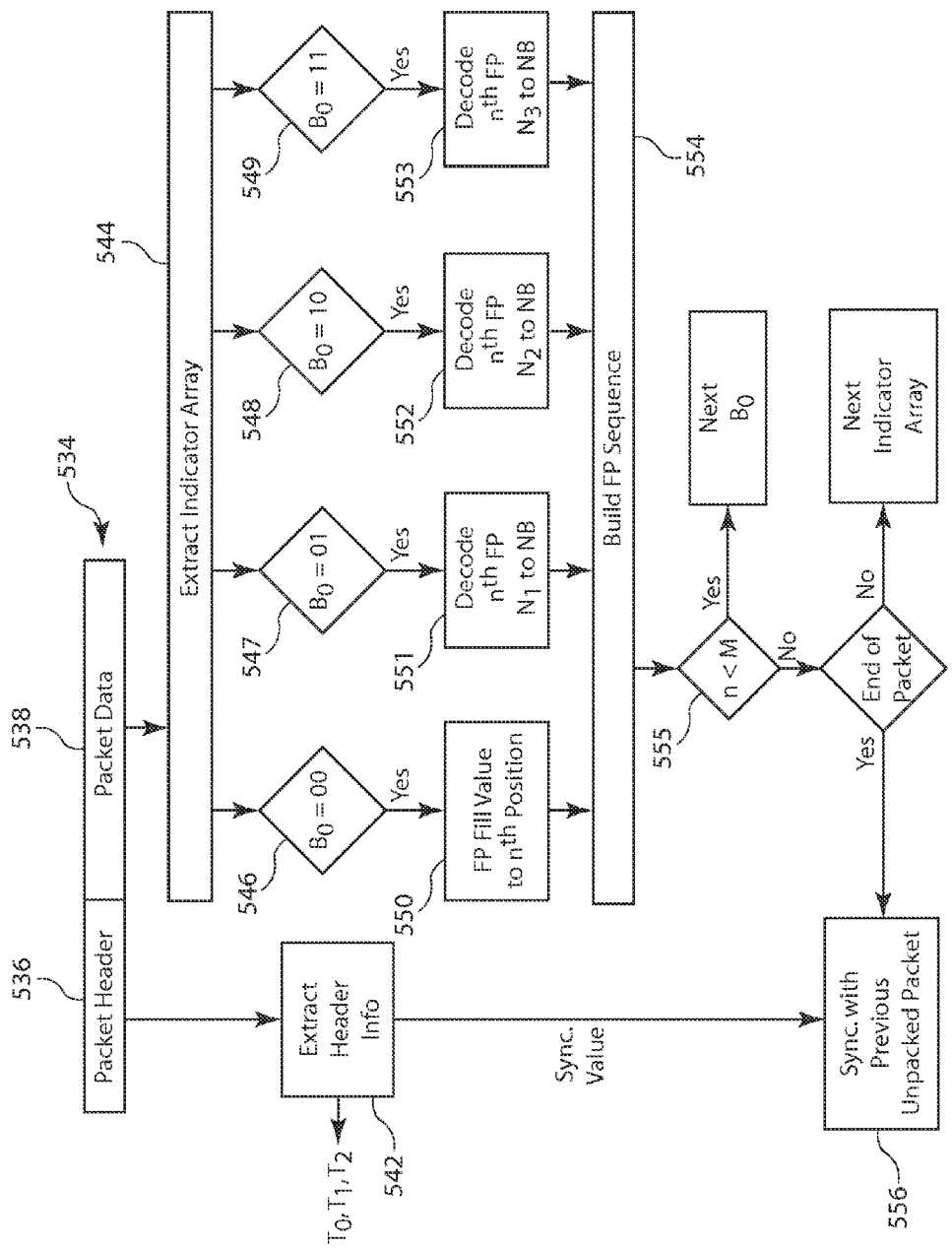
FIG. 15 is a block diagram of a decompressor in accordance with the third embodiment.

FIG. 15 is a block diagram of a decompressor in accordance with the third embodiment. Block 542 extracts the sync value and the threshold values $T_0$, $T_1$, and $T_2$ from the header section 536 of the packet 534. Block 544 extracts the indicator array from the packet data section 538. Blocks 546, 547, 548 and 549 test the value of the $n^{th}$ 2-bit indicator $B_0$ from indicator array 530. For the example illustrated, when $B_0$=00, block 550 provides a floating-point fill value to the $n^{th}$ position of a reconstructed floating-point sequence. Alternatively, the compressed data packet may contain encoded floating-point numbers, each having $N_0$ bits, corresponding to the lowest-valued class and the indicator value $B_0$=00. For this alternative, the encoded floating-point numbers corresponding to the indicator value $B_0$=00 would be unpacked and decoded as described in the following. When $B_0$=01, $B_0$=10 or $B_0$=11, blocks 551, 552 and 553 unpack from the FP data 532 and decode the corresponding floating-point number for the $n^{th}$ position of the reconstructed floating-point sequence. For $N_1$, $N_2$ or $N_3$ less than the original number of bits NB, the block 551, 552 or 553 decompresses the encoded floating-point number to provide a reconstructed floating-point number using the original number of bits NB. For example, if encoders 514, 516 and 518 truncated mantissa bits, the decoders 547, 548 and 549 may fill zeros in the truncated mantissa bits' positions to provide the reconstructed mantissa and combine the sign bit, the exponent and the reconstructed mantissa to form the reconstructed floating-point number. If the encoder 518 saved all the original NB bits ($N_3$=NB), the decoder 553 will simply unpack the corresponding floating-point number from the data section 578 of the packet 574. Block 554 provides the indexing and buffering for building the floating-point sequence from the floating-point numbers provided by blocks 550, 551, 552 and 553. Block 555 determines whether the M indicator bits $B_0$ have been processed. If not, the next indicator bit $B_0$ from the indicator array 530 is tested. Block 390 determines whether the end of the packet's data section 538 has been reached. If not, then block 544 extracts the next indicator array. If the end of the data section 538 has been reached, then block 556 synchronizes the current sequence of reconstructed floating-point numbers generated at block 554 with a previously sequence reconstructed floating-point numbers.

The exponent threshold $T_0$, described with respect to FIGS. 7, 10 and 13, may be set so that data less than $T_0$ are sufficiently low as to be insignificant in the calculations for the application. For example, an application may have pulsed or bursty data, exhibiting intermittent clusters of higher, significant values with runs of low magnitude or near-zero values. For another example, the dynamic range of the data to be processed together may include low magnitude floating-point values whose most significant digit is less than the least significant digit of the higher magnitude floating-point values. In such cases, the sum of the low and high floating-point numbers in a finite precision addition calculation would have no contribution from the low number. Setting the exponent threshold $T_0$ to eliminate zero, low magnitude or insignificant values, while preserving their location information, may often have little or no impact on the accuracy of the application's calculations. The indicator arrays described above preserve the location information of the eliminated low values in the compressed data packet. The location information may then be used by the decompressor to place fill values in the appropriate locations in the sequence of reconstructed floating-point numbers.

In another alternative, the exponent threshold $T_0$ may be set to an initial value, such as the minimum exponent value and subsequently iteratively adjusted. For a desired compression ratio, a control block may monitor the bit rate of the compressed data packets and adjust the exponent threshold $T_0$ to a higher or lower exponent value until the desired compression ratio is achieved.

In another alternative, a histogram of exponent values for a set of the floating-point numbers in application data is analyzed to determine the threshold $T_0$ that results in a particular compression ratio. In the following example of the second embodiment, when the floating-point exponent value is above $T_0$ all NB bits are encoded and when the floating-point exponent value is at or below $T_0$ the floating-point number is not saved, a compression ratio for a given threshold $T_0$ can be calculated as follows, 1) Calculate a histogram of exponent values for a set of N floating-point numbers for the application, where numExp(x) is the number of floating-point exponents in $x^{th}$ histogram bin, where x represents an exponent value, 2) Sum the number of exponents numExp(x) in histogram bins x less than or equal to $T_0$ (where the corresponding floating-point value will not be saved) and divide by N to give the fraction of exponents, fracExp($T_0$), 3) Calculate the compression ratio CR, $$CR = NB/[(NB+OB) - NB*fracExp(T_0)] \quad (2)$$

Where NB is the original number of bits per floating-point sample (i.e. 32 for single precision floating-point) and OB is the number of overhead bits per sample. For example, the number of overhead bits per sample may be the number of bits in the indicator $B_0$ per sample. The compression ratio CR is the ratio of the number of bits in the original samples of floating-point numbers to the number of bits in the corresponding compressed samples. For the embodiment of floating-point compression described with respect to FIGS. 9 to 11, the indicator array 370 adds one bit per sample (OB=1) of overhead to indicate whether the floating-point exponent value is above or below $T_0$. These overhead bits are offset by the eliminated samples whose exponents fall below the threshold. For example, one eliminated 32-bit floating-point number offsets the overhead bits for 32 samples.

To set a threshold $T_0$ to result in a given compression ratio $CR_0$, equation (2) is solved for fraction of exponents fracExp ($T_0$), $$fracExp(T_0) = (NB+OB)/NB - (1/CR_0) \quad (3)$$

Because the distribution of floating-point exponents depends on the data, the threshold $T_0$ may not meet the exact desired compression ratio $CR_0$. The following steps determine the threshold $T_0$ that provides at least the desired compression ratio:

1) Add successive histogram bins values numExp(x) from the minimum bin, minExp, to each bin x=X and divide by N to form the cumulative distribution of exponents cumDist (X), $$cumDist(X) = [SUM\ numExp(x)\ from\ x=minExp\ to\ x=X]/N$$

2) To select a threshold that results in at least the desired compression ratio $CR_0$, find $X_0$ where cumDist($X_0$)≥fracExp($T_0$)

3) Set the threshold $T_0=X_0$.

To maintain the desired compression ratio, the bit rate of the compressed data packets may be monitored and the threshold $T_0$ adjusted. Alternatively, the histogram of exponent values for subsequent sets of the floating-point numbers may be re-calculated or updated for subsequent sets of input samples and the threshold $T_0$ adjusted periodically as described above.

Figure 16:
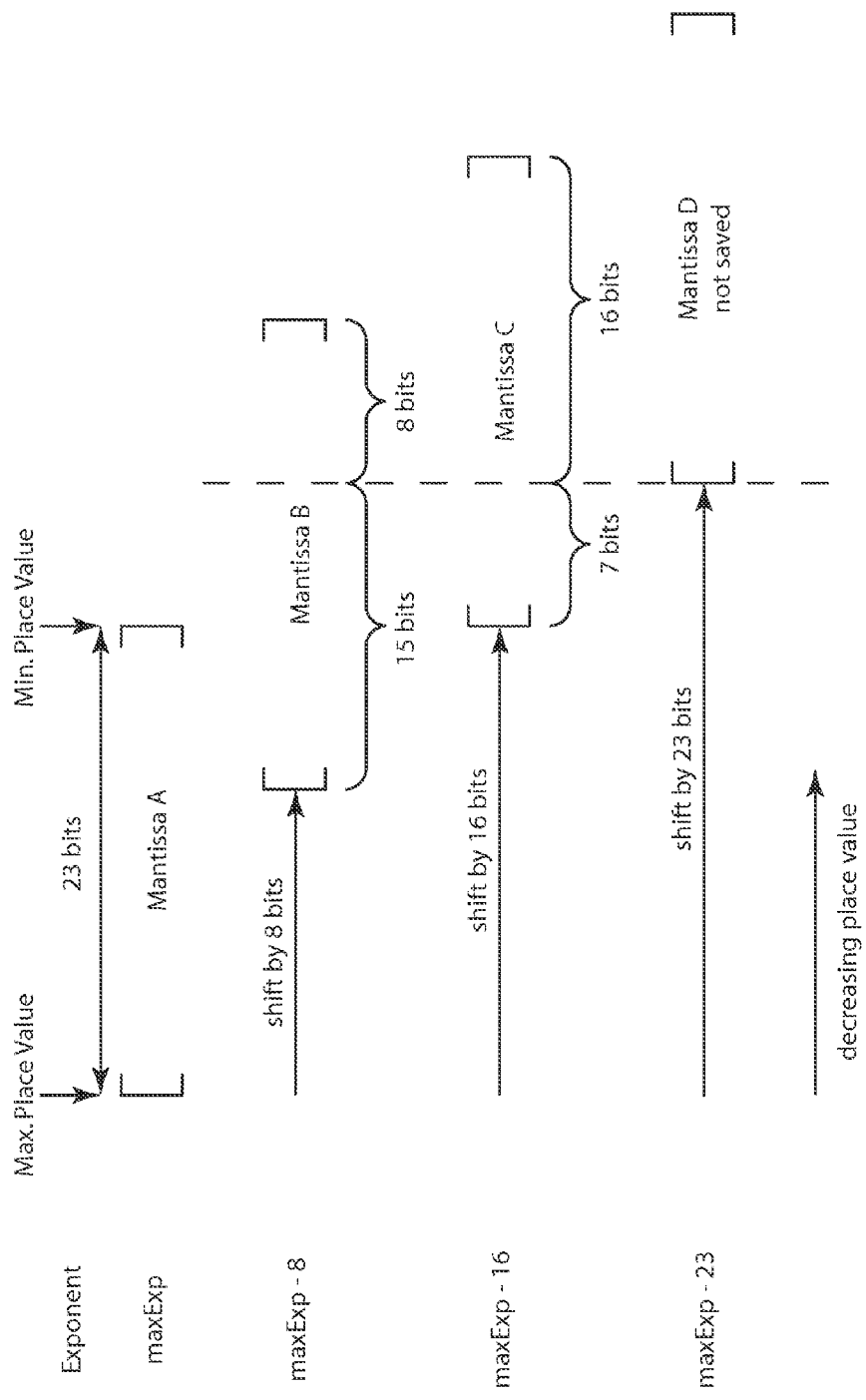
FIG. 16 illustrates an example of relative mantissa ranges when the offset=0 and the original mantissa size is 23 bits.

For multiple exponent thresholds, as described with respect to the third compression embodiment, the thresholds $T_0$, $T_1$ and $T_2$ determine four classes of floating-point numbers where different levels of compression are applied. For example, let the numbers of bits corresponding to respective classes of floating-point numbers may be set to $N_1=16$, $N_2=24$ and $N_3=32$, where the original number of bits NB=32. For $N_2=24$, eight bits are removed from the mantissa and for $N_1=16$, sixteen bits are removed from the mantissa. The exponent thresholds $T_0$, $T_1$ and $T_2$ may be set relative to the maximum exponent value, maxExp, for a group of floating-point numbers. The thresholds for a group of floating-point data to be encoded may be determined as follows:

1) Determine the maximum exponent value maxExp for the group of floating-point numbers,
2) Set $T_2$=maxExp−8−offset
3) Set $T_1$=maxExp−16−offset
4) Set $T_0$=maxExp−23−offset When the offset=0, this approach removes mantissa bits that are outside the mantissa range corresponding to the highest exponent value, maxExp. FIG. 16 illustrates an example of relative mantissa ranges when the offset=0 and the original mantissa size is 23 bits. Mantissa A represents the 23-bit binary place value range corresponding to the maxExp. The encoder 518 saves all 23 bits of the mantissas corresponding to the exponent values from maxExp to (maxExp−7). For the exponent value of (maxExp−8), the place value range of mantissa B shifts right by 8 bits relative to mantissa A. The lowest 8 bits of mantissa B are outside the place value range of mantissa A. The encoder 516 removes the lowest 8 bits from the mantissas corresponding to exponent values from (maxExp−8) to (maxExp−15). For the exponent value of (maxExp−16), the place value range of mantissa C shifts right by 16 bits relative to mantissa A. The encoder 514 removes the lowest 16 bits from mantissas corresponding to exponent values from (maxExp−16) to (maxExp−22). For the exponent value of (maxExp−23), the place value range of mantissa D has no overlap with mantissa A. The exponent (maxExp−23) corresponds to the exponent threshold $T_0$, so the corresponding floating-point numbers are not saved.

Figure 17:
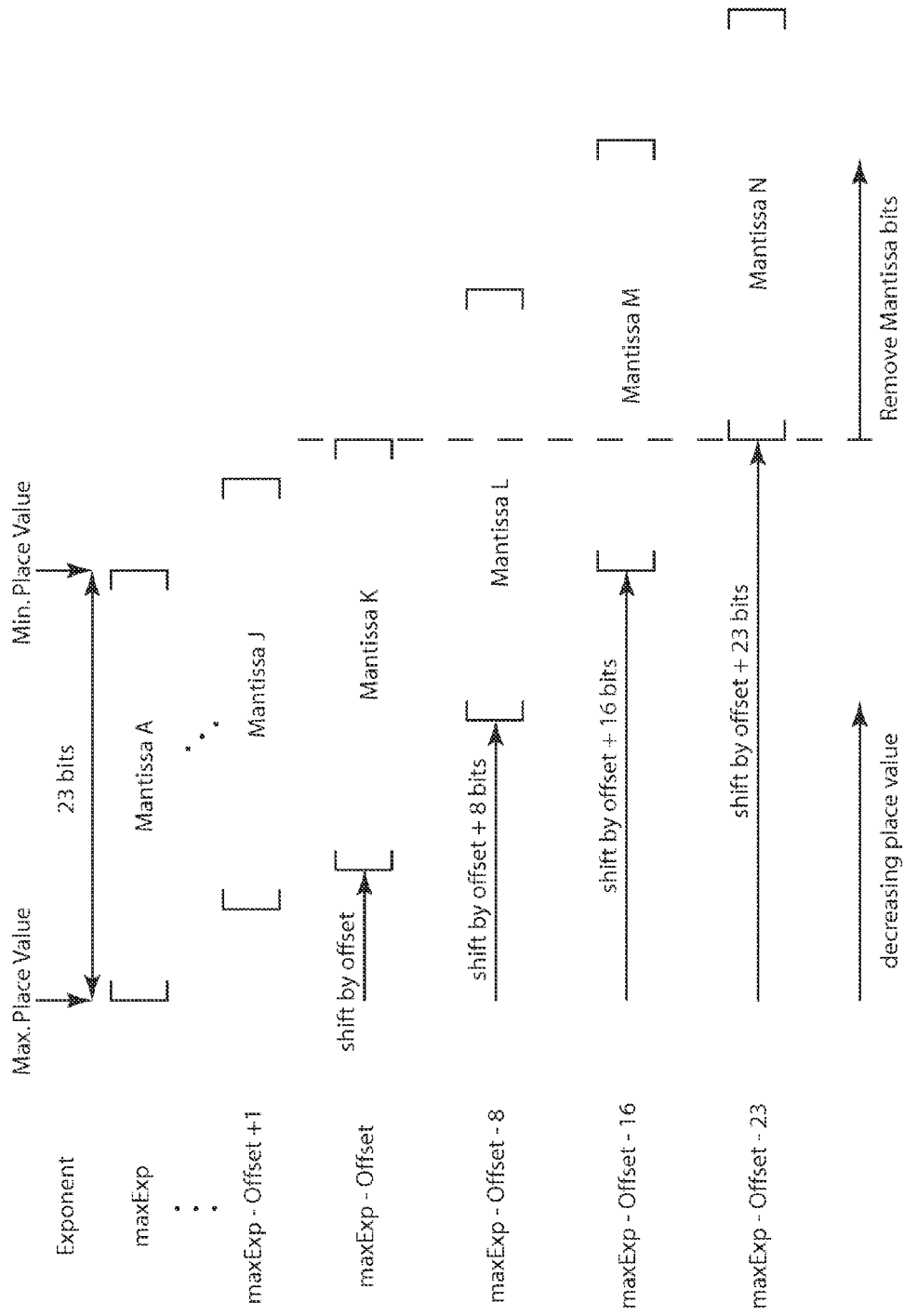
FIG. 17 illustrates an example of relative mantissa ranges when the offset is non-zero and the mantissa size is 23 bits.

FIG. 17 illustrates an example of relative mantissa ranges when the offset is non-zero and the mantissa size is 23 bits. The offset is a shift in exponent value relative to the maxExp value. A non-zero offset allows more mantissas to be represented with a higher numbers of bits. In this example, the encoder 518 saves all 23 bits of the mantissas corresponding to the exponent values from maxExp to (maxExp−offset−7). For exponent values from (maxExp−offset−8) to (maxExp−offset−15), the encoder 516 removes 8 bits from the corresponding mantissas, such as mantissa L. For exponent values from (maxExp−offset−16) to (maxExp−offset−22), the encoder 514 removes 16 bits from the corresponding mantissas, such as mantissa M. For exponent values equal or below (maxExp−offset−23), corresponding to the exponent threshold $T_0$, the floating-point numbers are not saved. This example shows one value for the offset, however the offsets can be different for the exponent thresholds $T_0$, $T_1$ and $T_2$. Offset values may be positive, zero or negative. Non-zero offset values may preserve more accuracy in calculations needed for an application.

The exponent thresholds $T_0$, $T_1$ and $T_2$ may be adjusted to different values for sets of floating-point numbers. This can support changes in the dynamic range in the data for different processing windows.

The compression ratio for floating-point data compressed using multiple exponent thresholds, as described with respect to the third compression embodiment, can be determined as follows. For examples described with respect to FIGS. 13 through 17, the exponent thresholds $T_0$, $T_1$ and $T_2$ define four classes of floating-point numbers where a different level of compression is applied to each class. The numbers of samples in the four classes can be calculated from the histogram of exponents of the floating-point data set.

1) Calculate a histogram of exponent values for a set of N floating-point numbers for the application, where numExp(x) is the number of floating-point exponents in $x^{th}$ histogram bin, where x represents an exponent value,
2) Sum the number of exponents numExp(x) in histogram bins x less than or equal to $T_0$ (the corresponding floating-point sample will not be saved) and divide by N to give the fraction of exponents, fracExp($T_0$),
3) Sum the number of exponents numExp(x) in histogram bins $T_0<x\le T_1$, where $N_1$ bits will be saved per floating-point sample, and divide by N to give the fraction of exponents fracExp($T_1$),
4) Sum the number of exponents numExp(x) in histogram bins $T_1<x\le T_2$, where $N_2$ bits will be saved per floating-point sample, and divide by N to give the fraction of exponents fracExp($T_2$),
5) Sum the number of exponents numExp(x) in histogram bins $T_2<x$, where $N_3$ bits will be saved per floating-point sample, and divide by N to give the fraction of exponents fracExp(max),
6) Determine the reduction in the number of bits, lessBits, for the compressed floating-point samples in the four classes:

lessBits=fracExp(max)[NB−$N_3$]+fracExp($T_2$)[NB−$N_2$]+ fracExp($T_1$)[NB−$N_1$]+fracExp($T_0$)*NB  (3)

where NB is the original number of bits per sample and the terms in the square brackets correspond to the numbers of bits removed from the mantissas. For $N_3$=NB, no bits are removed from the mantissa and the first term drops out. The lessBits term is a function of the exponent thresholds $T_0$, $T_1$ and $T_2$.

7) Calculate the compression ratio CR,

CR=NB/[(NB+OB)−lessBits]  (4)

where OB is the number of overhead bits per sample. For example, the number of overhead bits per sample may be the number of bits in the indicator $B_0$ per sample, so that OB=2 for the third compression embodiment. For a desired compression ratio, the exponent thresholds $T_0$, $T_1$ and $T_2$ may be adjusted and equations (3) and (4) calculated until the desired compression ratio CR is met for the data set.

The above examples for multiple exponent thresholds $T_0$, $T_1$ and $T_2$ have assumed single precision floating-point data, where the original number of bits per sample is 32 and the number of mantissa bits is 23. For the exponent thresholds above $T_0$, it is preferable to reduce the corresponding mantissas by multiples of 8 bits to produce compressed data in byte increments. For double precision floating-point data, where the original number of bits per sample is 64 and the number of mantissa bits is 52, up to six exponent thresholds above $T_0$ may be applied to reduce the corresponding mantissas by multiples of 8 bits. For more than four exponent thresholds, the indicator array would contain 3-bit indicators $B_0$ for to eight samples or a multiple of eight samples. Alternatively, three exponent thresholds above $T_0$ may be applied may be applied to reduce the corresponding mantissas by multiples of 16 bits. In other alternatives, exponent thresholds may be set so that a so that some classes of mantissas are reduced by 8 bits and others by 16 bits. Data types having 8, 16, 32 or 64 bits can be manipulated using instructions from a typical software instruction set for CPUs and GPUs. In other embodiments, such as hardware implementation, the number of bits removed may be arbitrary.

The following describes techniques for separately compressing the sign 12, mantissa 16 and exponent 14 of a floating-point number 10. The encoder block 312 described with respect to FIG. 7, encoder block 358 described with respect to FIG. 10 and the encoder blocks 514, 516 and 518 described with respect to FIG. 13 may apply compression to the floating-point numbers in accordance with these techniques. Alternatively, the following embodiments of compression may be applied directly to the floating-point numbers.

Figure 18:
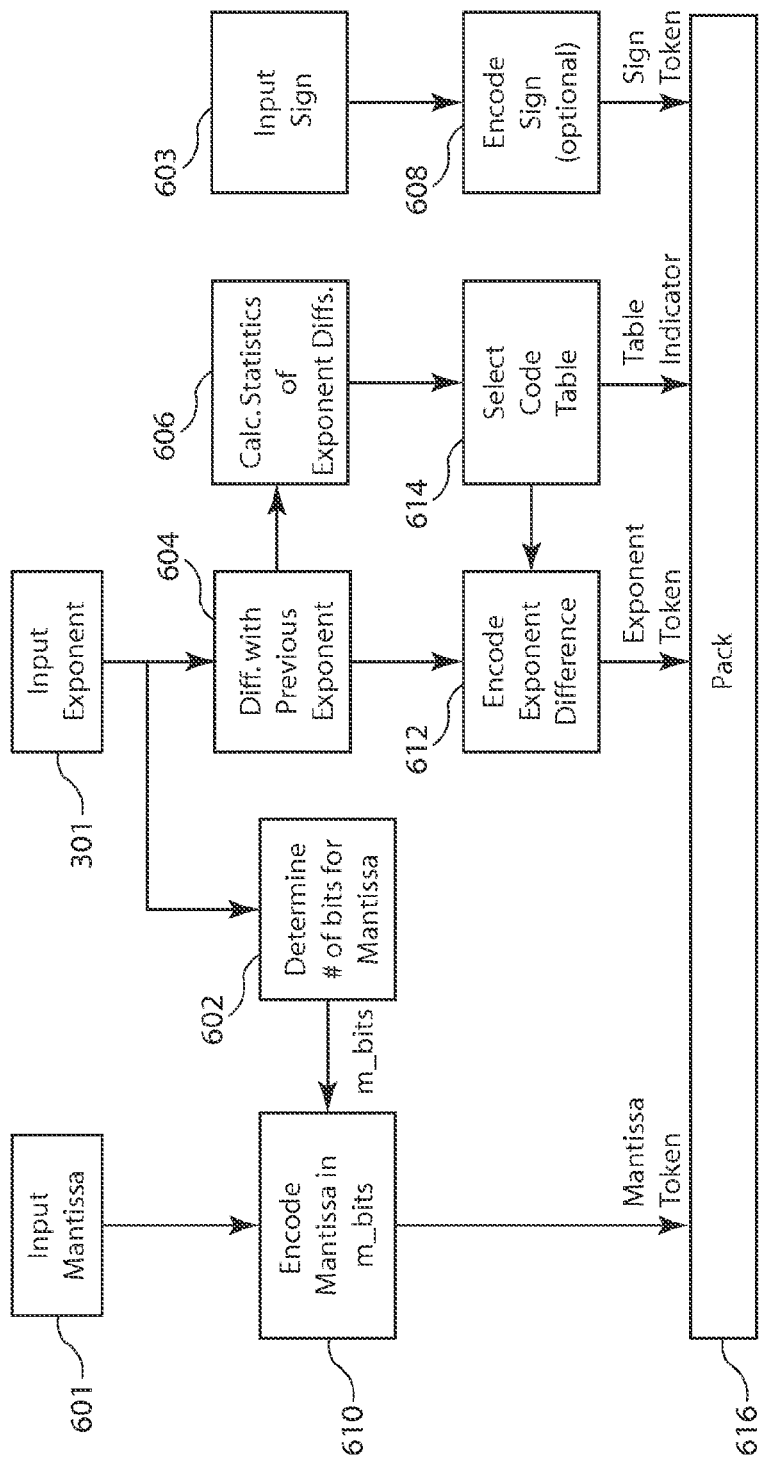
FIG. 18 is a block diagram of floating-point compression in accordance with a fourth embodiment.

FIG. 18 is a block diagram of floating-point compression in accordance with a fourth embodiment. The sign 12, exponent 14 and mantissa 16 of a floating-point number 10 are compressed individually. Blocks 604, 606, 612 and 614 perform aspects of exponent compression. Differential encoding may be applied to the input exponents 301, where exponent difference values are encoded to produce exponent tokens. The difference block 604 calculates the difference between the current input exponent 301 and the previous input exponent to form an exponent difference. Block 606 calculates statistical measurements of the exponent differences for a set of input exponents 301. The statistical measurements of exponent differences can include one or more of a histogram, minimum, maximum, median, mean, standard deviation or other measurement. Block 614 uses the resulting statistical measurement to select a code table used to encode the exponent differences in the set and its associated table indicator. The code table comprises a look-up table that relates the exponent difference values to corresponding exponent tokens that will represent the exponent differences using fewer bits, as described below. The exponent encoder block 612 selects the exponent token corresponding to the calculated exponent difference from the code table. The first encoded exponent of the compressed data packet 620 may be absolutely encoded using an escape 'ESC' token (FIG. 21) followed by the original exponent 301. Blocks 602 and 610 perform aspects of mantissa compression. Block 602 determines the number of mantissa bits, m_bits, to be used for the compressed mantissa token based on the value of the corresponding input exponent 301. Block 602 may use a look-up table or function block implementing a mapping function that relates the exponent value to the number of mantissa bits, as further described below. The mantissa encoder block 610 saves m_bits of the most significant bits (MSBs) of the NM bits of the input mantissa 601 to form the mantissa token, where m_bits≤NM bits. The sign encoder 608 may compress groups of signs as described below. Alternatively, the input sign 603 may be packed in uncompressed form as the sign token. The packetizer 616 packs the tokens for the signs, mantissas and exponents in the data portion of a packet for the corresponding set of floating-point data. The packet may include header portion with synchronization information and table indicator information.

To compress the signs of a group of floating-point numbers, the sign encoder 608 may test for runs of the same sign. Groups of NS sign bits are compressed as follows, where NS=4:

1) For a group of NS sign bits 'abcd', test if the NS sign bits are all the same, i.e. a=b=c=d, if not go to step 4;

2) If so, test if the NS sign bits have the same value 'z' as the last bit of the previous group of NS sign bits 'wxyz', if not go to step 4);

3) If so, set the sign token sToken='0' for the current group of NS sign bits;

4) Otherwise, set the sign token sToken='1 abcd'.

For this encoding scheme, when the signs remain the same for adjacent groups of NS samples, a single 1-bit sign token, sToken, per group is set to '0' to represent the signs for each of the NS samples in each group. When the adjacent groups do not have the same signs, the sign token of length (NS+1), includes a leading '1' followed by the original NS sign bits. Decoding a group of compressed sign bits is as follows:

1) Does first bit=1? If not go to step 3;

2) If so, the next NS bits are the original signs, i.e. 'abcd';

3) Otherwise, the current NS bits are the same as the last bit of the previous group of four sign bits 'wxyz', i.e. a=z, b=z, c=z, d=z.

Figure 19:
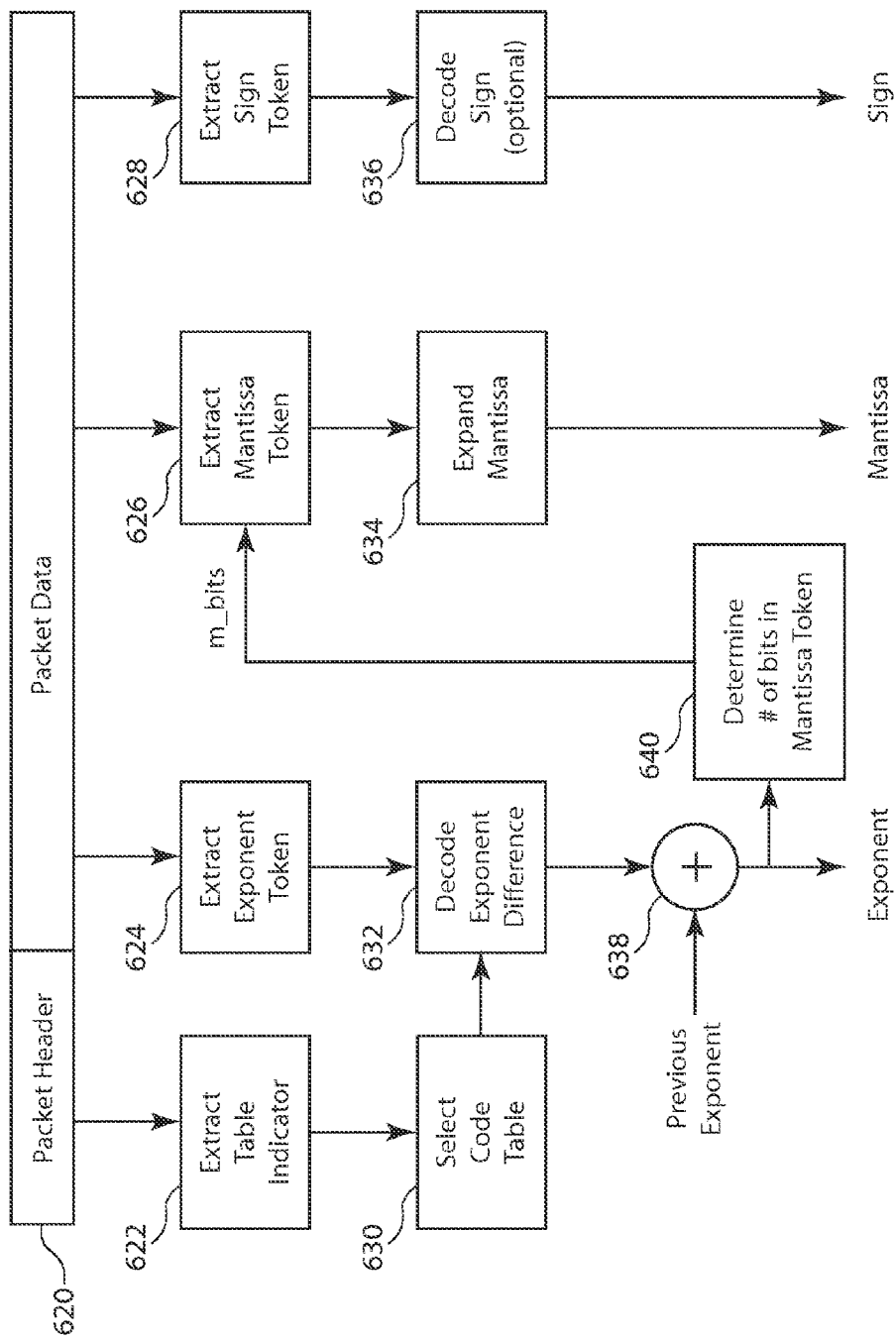
FIG. 19 is a block diagram of floating-point decompression in accordance with the fourth embodiment.

FIG. 19 is a block diagram of floating-point decompression in accordance with the fourth embodiment. The packet 620 contains table indicator information in the header portion and the tokens for the encoded signs, exponents and mantissas in the data portion. Blocks 630, 632 and 638 perform aspects of exponent decompression. Block 622 extracts the table indicator information from the packet header. Block 630 selects the code table corresponding to the table indicator. The code table comprises a look-up table or function that relates the exponent tokens to the exponent difference values, corresponding to the code table used for encoding. Block 624 extracts the exponent token from the data portion of the packet 620. Decoder block 632 determines the decoded exponent difference corresponding to the exponent token in the code table. The adder 638 sums the decoded exponent difference with the previous exponent to produce the current exponent. If the encoded exponent was absolutely encoded, rather than differentially encoded, the addition 638 with the previous exponent may be bypassed. Blocks 634 and 640 perform aspects of mantissa decompression. Block 640 determines the number of bits in the corresponding mantissa token, m_bits, based on the current exponent value. Block 640 may use a look-up table or function block implementing the mapping function that relates the exponent value to the number of mantissa bits, as further described below. Block 626 extracts the m_bits number of bits comprising the current mantissa token from the data portion of the packet 620. Block 634 expands the mantissa token to reconstruct the mantissa, where the m_bits MSBs of the reconstructed mantissa contain the mantissa token and the NM−m_bits least significant bits (LSBs) of the reconstructed mantissa are set to zeros. Block 628 extracts the corresponding sign token from the data portion of the packet 620. The decoder 636 decompresses the sign token as described above. Alternatively, if the signs were not compressed, the sign token is the uncompressed sign bit. The reconstructed floating-point number contains the reconstructed sign, exponent and mantissa in the desired floating-point format.

Figure 20:
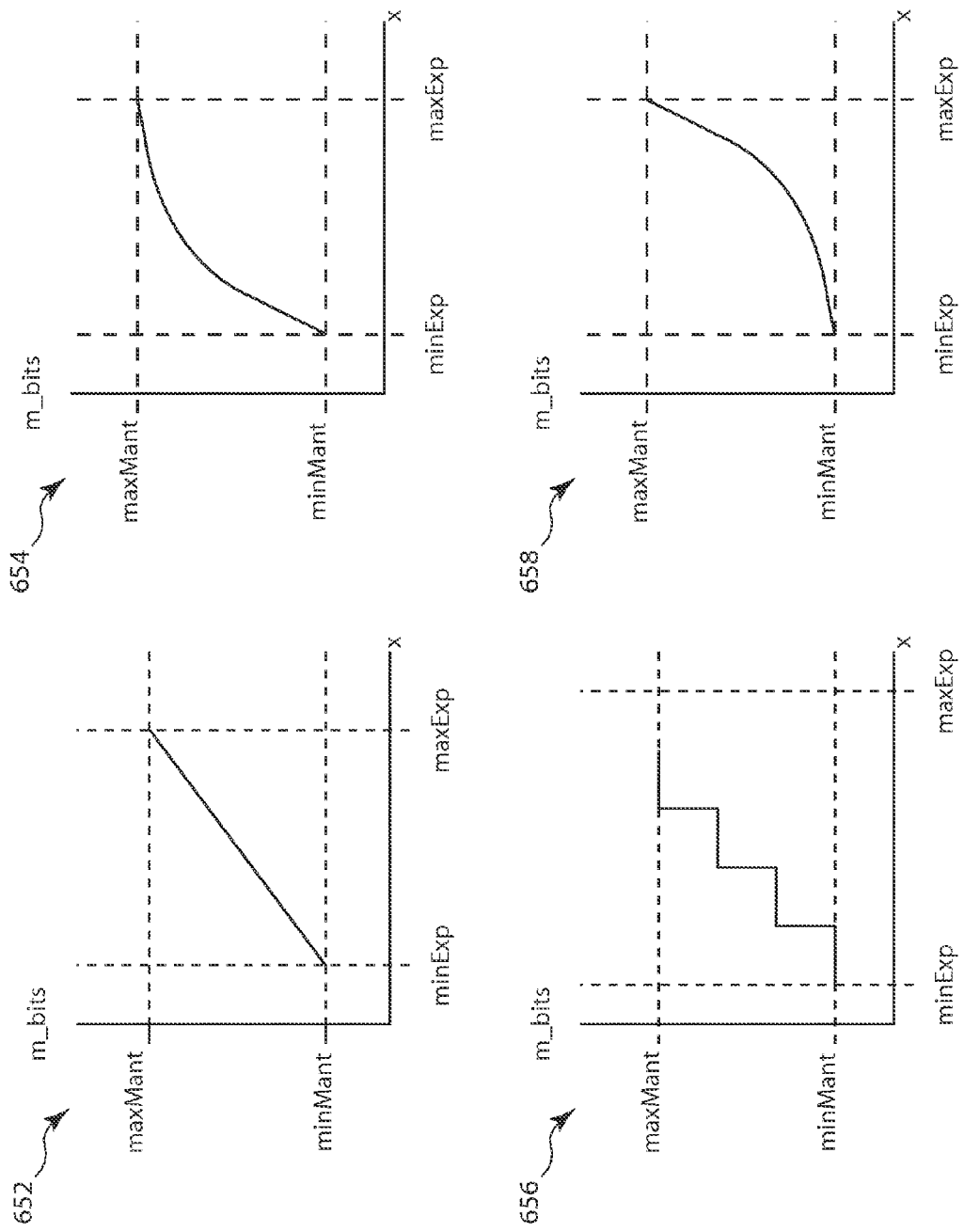
FIG. 20 illustrates several mapping functions for the number of mantissa bits as a function of the exponent value for determining the number of bits for the compressed mantissa.

FIG. 20 illustrates several mapping functions for the number of mantissa bits as a function of the exponent value for determining the number of bits for the compressed mantissa. The horizontal axes indicate possible exponent values, the variable "x", of the input exponent 301. The minimum and maximum exponent values are indicated by minExp and maxExp. The values of minExp and maxExp may correspond to the minimum and maximum exponent values for the floating-point format, such as −127 and +128, respectively, for 8-bit exponents, or −1023 and +1024, respectively, for 11-bit exponents. Alternately, minExp and maxExp may represent an exponent range of interest that is determined by the statistics of the exponents in a set of floating-point numbers. These exponent statistics may be calculated once for the set or may be periodically updated, thus updating minExp and maxExp. The statistics may be calculated by generating an exponent histogram, monitoring and/or averaging the minimum and maximum exponents for a time period, or other method of monitoring exponent statistics. If minExp and maxExp are updated periodically for sets of floating-point numbers, their updated values may be included in the header portion of each packet 620. The vertical axes in FIG. 20 indicate the number of mantissa bits, m_bits, that will represent the compressed mantissa. The value minMant is the minimum value for m_bits and the value maxMant is the maximum value for m_bits. The mapping function for determining m_bits as a function of the exponent values is referred to herein as mapMant(x), where x represents an exponent value. Graph 652 illustrates a linear function of the exponent value to determine the value of m_bits. Graph 656 illustrates a stepwise mapping function. Graphs 654 and 658 illustrate nonlinear mapping functions. Parameters for the mapping functions, such as minMant, maxMant, the step parameters in graph 656, the shape parameters in graphs 654 and 658, may be determined based on the statistics of a set of floating-point numbers for the application to achieve a particular compression ratio for the mantissa bits. For example, a procedure to calculate the number of mantissa bits for the compressed mantissas is as follows, 1) Calculate a histogram of exponent values for a set of N floating-point numbers for the application, where numExp(x) is the number of floating-point exponents in $x^{th}$ histogram bin, where x represents an exponent value, 2) Set parameters for the mapping function mapMant(x) for x from minExp to maxExp (determined from the exponent histogram), for parameter such as minMant, maxMant, step heights and thresholds (graph 656), shape parameters (graphs 654 and 658), to construct a mapMant(x) that gives m_bits as a function of x, 3) Multiply the histogram values numExp(x) times the corresponding m_bits values in mapMant(x) for x from minExp to maxExp, 4) Sum over the products in step 3 to give the total number of compressed mantissa bits for the set of N floating-point numbers.

The total number of compressed mantissa bits may be added to the number of bits for the compressed exponents and signs to determine the number of bits for the compressed floating-point numbers. The number of bits in the N original floating-point numbers (NB*N) can be divided by the calculated number of compressed bits to give the compression ratio.

Referring to FIG. 18, block 602 may use a look-up table or function block to determine the number of mantissa bits, m_bits, as a function of the exponent value. In a look-up table implementation of mapMant(x), the values for m_bits and the associated exponent values (x) are stored in memory. Alternatively, block 602 may include a function block that implements equations for the mapping function mapMant(x). Multiple mantissa mapping functions mapMant(x) may be selectable by the mantissa map indicator, each associated with a different mapMant(x). For example, the mapMant(x) may be selected based on a desired compression ratio. For the look-up table implementation, multiple look-up tables may be stored in memory, each associated with a respective mantissa map indicator. For the function block implementation, the mantissa map indicator may be a control parameter to transfer control of execution to the appropriate function block for mapMant(x). For multiple mantissa mapping functions, the packetizer 616 may save the mantissa map indicator in the header portion of the packet 620. Referring to FIG. 19, the decompression operations would further include extracting the mantissa map indicator from the header portion and providing it to block 640. The operations of block 640 would further include using the mantissa map indicator to select the associated mapMant(x). Block 640 may include a look-up table implementation or a function block implementation for mapMant(x), as described above. Block 640 applies the associated mapMant(x) for x equal to the value of the exponent to determine the value of m_bits.

FIG. 21 gives examples of code tables for the exponent differences. The code tables include exponent tokens for more frequent exponent difference values, ranging from −3 to +3. For exponent difference values outside this range, an escape (ESC) token is followed by the actual exponent value, using the original number of exponent bits, NE. Alternatively, the escape (ESC) token is followed by the actual exponent difference value, using the original number of exponent bits, NE. The exponent tokens may be Huffman codes that are generated based on the frequency of occurrence of the exponent differences. Each table corresponds to a different probability distribution of the exponent differences. The exponent differences in the tables are arranged in frequency order from most frequent to least frequent and are matched with tokens whose lengths are arranged from shortest to longest. Thus more frequent exponent differences are mapped to shorter tokens and less frequent exponent differences are mapped to longer tokens. This mapping of exponent differences, rather than exponents, may reduce the number of bits required to represent sequences of floating-point exponents. The examples in Tables 1, 2 and 3 are for illustrative purposes only. Other code tables could be generated based on the probability distribution of other exponent difference values and provide different exponent tokens. Alternatively, the code tables may be generated by other entropy coding methods. In a preferred embodiment, multiple selectable code tables are generated in advance and stored in memory accessible to block 614 in FIG. 18. Block 614 selects the code table giving the most efficient representations for a given set of floating-point exponents. Block 606 makes statistical measurements of the exponent differences to support table selection by block 614. For example, the number of bits used to represent the exponent differences for N floating-point numbers using a particular code table can be calculated as follows:

1) Calculate a histogram of exponent difference values for a set of N floating-point numbers, where numDiff(z) is the number of exponent difference values in $z^{th}$ histogram bin, where z represents an exponent difference value, 2) For each exponent difference value z corresponding to an exponent token in the code table, multiply numDiff(z) by the corresponding token length from the code table, 3) For the exponent difference values z corresponding to "all others" in the code table, multiply numDiff(z) by (ESC token length+NE), 4) Sum the products generated by steps 2) and 3) to give the total number of bits for encoding the N exponent differences using the particular code table.

The total number of bits to encode the N exponent differences can be calculated for each of the selectable code tables.

Block 614 may select the code table corresponding to the minimum number of bits as calculated above. The packetizer 616 may store the table indicator corresponding to the selected code table in the header section of the packet 620. Referring to FIG. 19, in a preferred embodiment, selectable code tables corresponding to those used for encoding are stored in memory accessible to block 630. Block 630 may use the table indicator extracted from the header of the received packet 620 to select the corresponding code table. The decoder block 632 may match the received exponent token with exponent tokens in the selected code table to determine corresponding exponent difference.

In an alternative embodiment of exponent compression, the input exponents 301 are mapped to exponent tokens, rather than exponent differences. Referring to FIG. 18, the exponent differencing block 604 is omitted and blocks 612 and 606 may be applied to the input exponents 301. Code tables, such as those described with respect to FIG. 21, would relate exponent values to corresponding exponent tokens. Referring to FIG. 19, the block 632 would decode the exponent token to produce the decoded exponent and the adder 638 is omitted.

Figure 22:
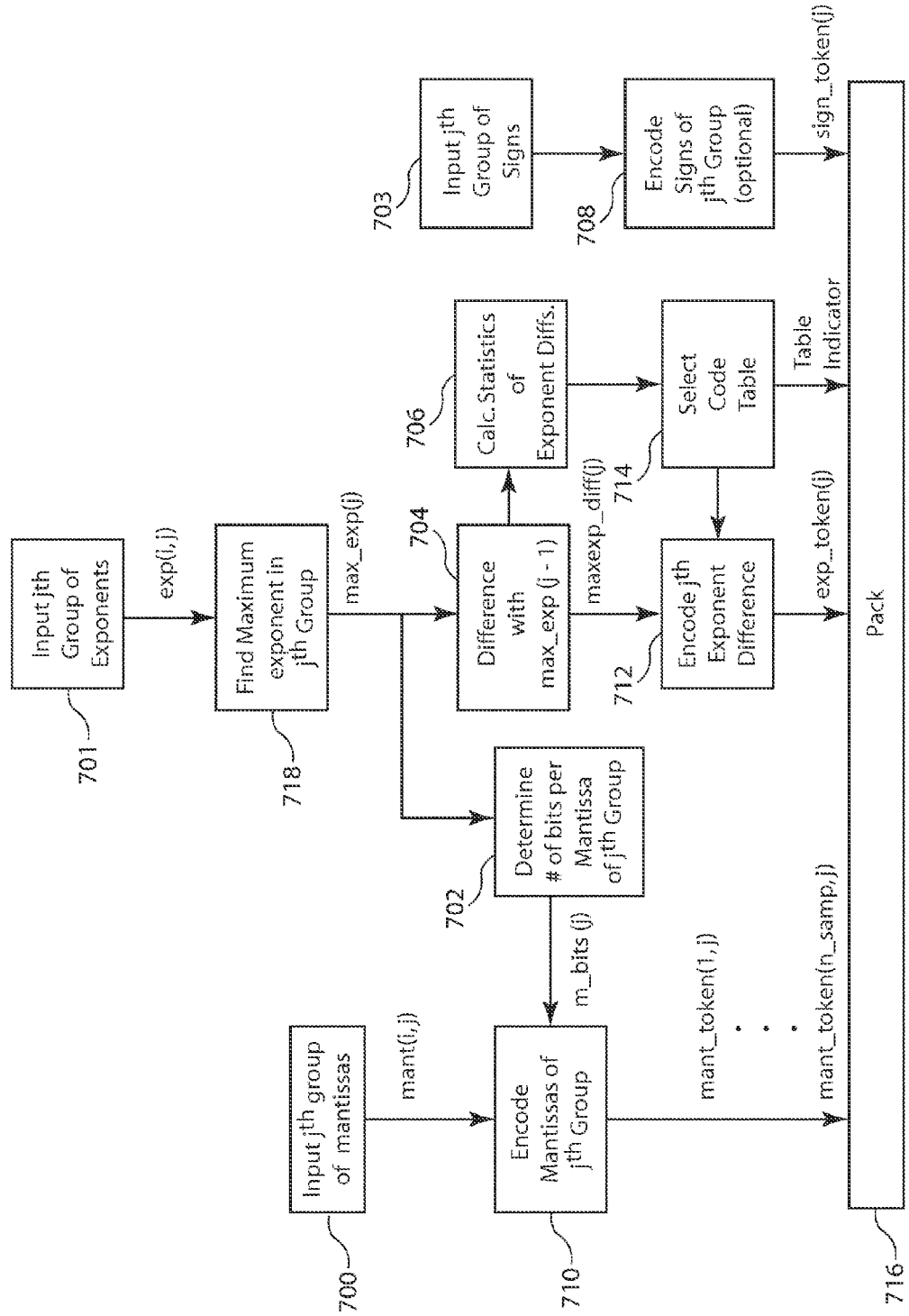
FIG. 22 is a block diagram of floating-point compression in accordance with a fifth embodiment.

FIG. 22 is a block diagram of floating-point compression in accordance with a fifth embodiment. In this embodiment, an encoding group of n_samp floating-point numbers share a single exponent token. For the n_samp floating-point numbers 10, the signs 12, mantissas 16 and exponents 14 are compressed separately. Blocks 704, 706, 712, 714 and 718 perform aspects of exponent compression. Block 701 extracts the exponents from the $j^{th}$ encoding group of floating-point samples, to provide input exponents exp(i,j) where $1 \leq i \leq n\_samp$. Block 718 determines the maximum exponent value in the $j^{th}$ encoding group, max_exp(j). Block 704 subtracts the maximum exponent from the previous encoding group of exponents, max_exp(j−1) to form the maximum exponent difference, maxexp_diff(j). Block 706 calculates statistical measurements of the differences maxexp_diff(j) for multiple encoding groups of exponents 701 in a set of input floating-point numbers. The statistical measurements of maxexp_diff(j) for the multiple encoding groups in the set can include one or more of a histogram, minimum, maximum, median, mean, standard deviation or other measurement. Block 714 uses the resulting statistical measurement to select a code table used to encode the maximum exponent differences maxexp_diff(j) and its associated table indicator. The exponent encoder block 712 selects the exponent token exp_token(j) from the code table that corresponds to the value of maxexp_diff(j). The exp_token(j) will be the only exponent token for the $j^{th}$ encoding group of compressed samples. Blocks 702 and 710 perform aspects of mantissa compression. Block 700 extracts the n_samp mantissas from the $j^{th}$ encoding group of floating-point samples, to provide mant(i, j), where $1 \leq i \leq n\_samp$. Block 702 determines the number of mantissa bits, m_bits(j), to be used for each compressed mantissa token in the $j^{th}$ encoding group. The number of mantissa bits, m_bits(j) is based on the value of the maximum exponent for the encoding group, max_exp(j). Block 702 may use a look-up table or function block that relates the maximum exponent value to the number of mantissa bits, as described above with respect to FIG. 20 and block 602 (FIG. 18). However, block 702 uses the max_exp(j) to determine the number of mantissa bits m_bits(j) on group by group basis, rather than the sample by sample basis described for block 602. The mantissa encoder block 710 encodes the mantissas of the $j^{th}$ encoding group to form n_samp mantissa tokens, mant_token(i,j), each having m_bits, as described below. Block 703 extracts the n_samp sign bits from the $j^{th}$ encoding group of floating-point samples. The sign encoder 708 may compress groups of signs, as described above, to provide a sign token, sign_token(j), for the $j^{th}$ encoding group of compressed samples. Alternatively, the input signs may be packed in uncompressed form. For the $j^{th}$ encoding group, the packetizer 716 packs the single exponent token exp_token(j), the sign_token(j) for the compressed signs, and the n_samp mantissa tokens mant_token(i,j), where $1 \leq i \leq n\_samp$ in the data portion of the packet. Preferably, the packet contains tokens for multiple encoding groups of compressed samples. The packet may include header portion with synchronization information and table indicator information.

Figure 23:
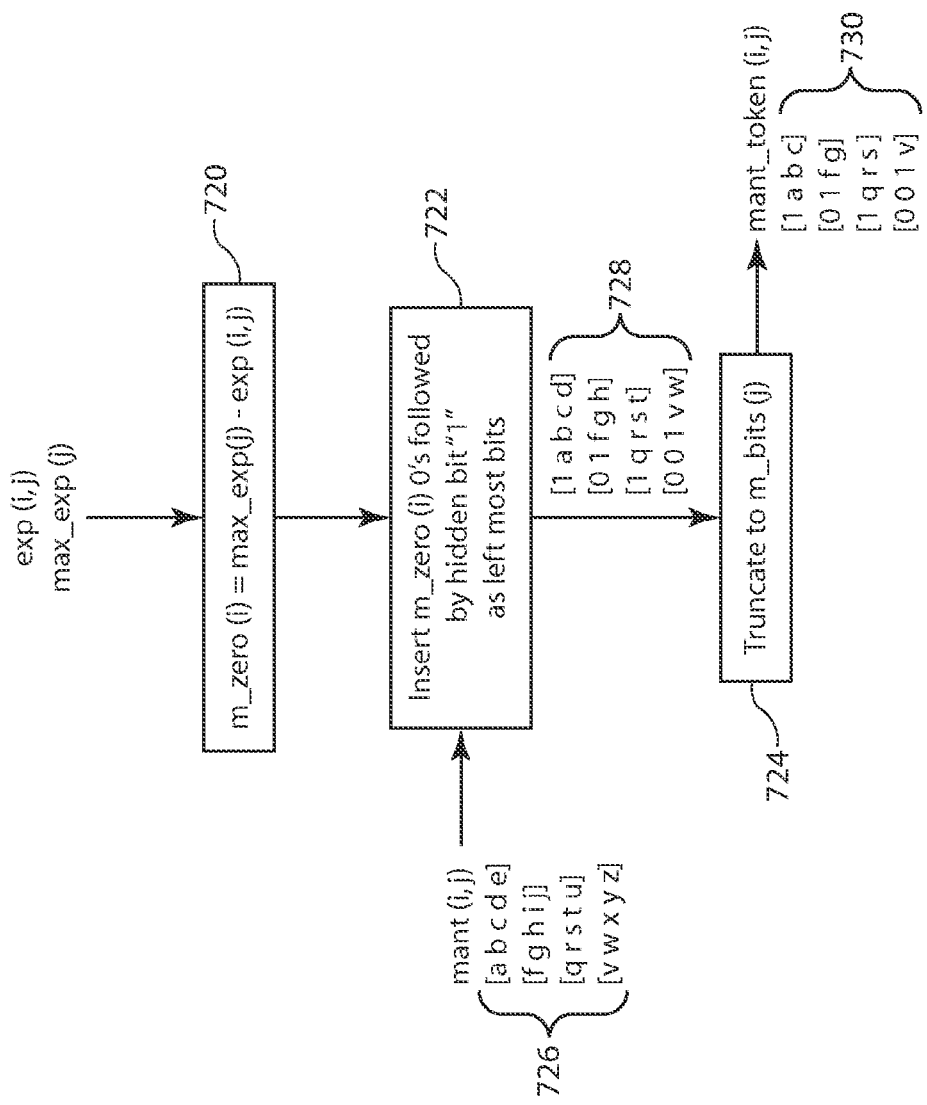
FIG. 23 is a block diagram of the mantissa encoder 710 for the $j^{th}$ encoding group of mantissas.

FIG. 23 is a block diagram of the mantissa encoder 710 for the $j^{th}$ encoding group of mantissas. The mantissa encoder 710 encodes each mantissa in the $j^{th}$ encoding group to m_bits (j) bits. Since there is only one exponent token exp_token(j) for the $j^{th}$ encoding group, the encoding includes aligning the mantissa bits in each encoding group to preserve the appropriate binary place values. To align the mantissa bits properly, the hidden bit "1" and, if necessary, leading zeros are inserted in left-most bits of the mantissas corresponding to the lower valued exponents in the $j^{th}$ encoding group. The alignment of the mantissas is analogous to creating a group of "local" fixed-point mantissas. For the $i^{th}$ mantissa in the $j^{th}$ encoding group, block 720 determines the number of leading zeros by subtracting the corresponding exponent, exp(i,j) from the maximum exponent max_exp(j) to give m_zero(i). Block 722 inserts the m_zero(j) zeros followed by the hidden bit "1" as the leftmost bits to align the mantissa's binary place values to form n_samp place-aligned mantissas for the $j^{th}$ encoding group. The zeros and "1" bits may be shifted in as LSBs are shifted out. When exp(i,j) equals max_exp(j), the hidden bit "1" is inserted, but not leading zeros. Block 724 truncates the place-aligned mantissas to m_bits(j) to form the mantissa tokens for the $j^{th}$ encoding group, mant_token(i,j). For example, a group of input mantissas 726 has 5 bits, for simplicity. Block 722 forms place-aligned mantissas 728 by shifting in the hidden bit "1" and the number m_zero of zeros. For compression, block 724 truncates the place-aligned mantissas 728 to m_bits(j), which is 4 bits for this example, to produce the group of mantissa tokens 730 representing compressed mantissas.

Figure 24:
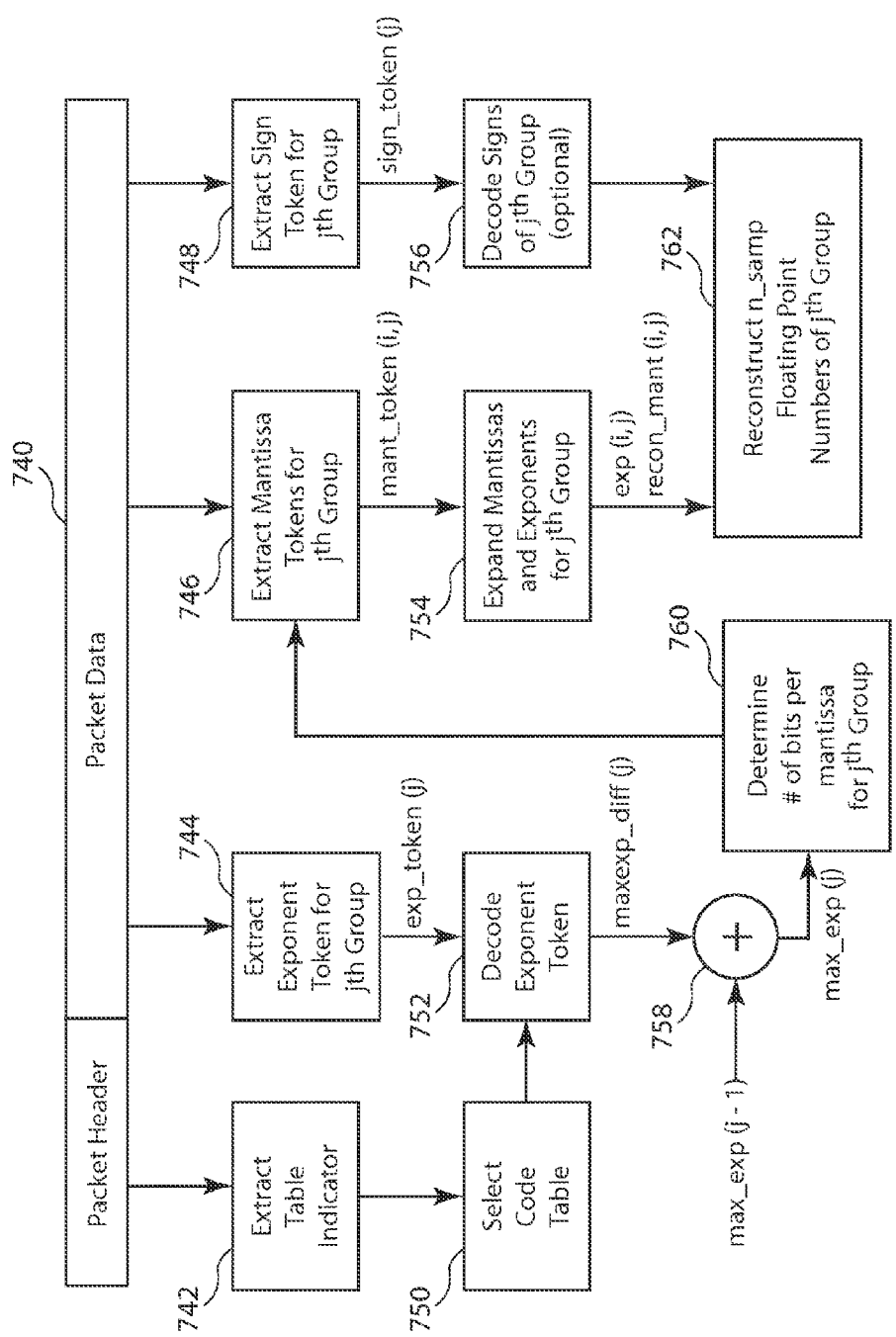
FIG. 24 is a block diagram of floating-point decompression in accordance with the fifth embodiment.

FIG. 24 is a block diagram of floating-point decompression in accordance with the fifth embodiment. The packet 740 contains the groups of tokens for the encoded exponents, signs and mantissas in the data portion. The packet 740 contains table indicator information in the header portion. Block 742 extracts the table indicator information from the packet header. Blocks 750, 752, 758 and 762 perform aspects of exponent decompression. Block 750 selects the code table corresponding to the table indicator. The code table comprises a look-up table that relates the exponent tokens, exp_token, to the maximum exponent difference values, maxexp_diff. Block 744 extracts the exponent token for the $j^{th}$ encoding group, exp_token(j), from the data portion of the packet 740. Decoder block 752 determines the decoded maximum exponent difference, maxexp_diff(j), corresponding to the exp_token(j) in the code table. The adder 758 adds the decoded maxexp_diff(j) to the maximum exponent for the previous encoding group, max_exp(j−1) to produce the current maximum exponent, max_exp(j). Blocks 754, 760 and 762 perform aspects of mantissa decompression. Block 760 determines the number of bits in the mantissa tokens for the $j^{th}$ encoding group, m_bits(j), based on the value of the current maximum exponent, max_exp(j). Block 746 may use a look-up table or equation that relates the maximum exponent value to the number of mantissa bits, as described above with respect to FIG. 22. Block 746 extracts the m_bits(j) bits for each mantissa token of the $j^{th}$ encoding group, mant_token(i, j), where $1 \leq i \leq n\_samp$. Decoder block 754 expands the mantissa tokens of the $j^{th}$ encoding group to reconstruct the n_samp reconstructed mantissas, recon_mant(i,j), each having NM bits. In addition to expanding the mantissas, decoder block 754 reconstructs the exponent values for the $j^{th}$ encoding group, exp(i,j) as described below. Block 748 extracts the sign token for the $j^{th}$ encoding group, sign_token(j) from the data portion of the packet 740. The sign decoder 756 decompresses the sign_token(j), as described above. Alternatively, if the signs were not compressed, the sign_token(j) contains the uncompressed sign bits for the $j^{th}$ encoding group. Block 762 reconstructs the n_samp floating-point numbers of the $j^{th}$ encoding group, each having the reconstructed sign, reconstructed exponent and reconstructed mantissa in the desired floating-point format.

Figure 25:
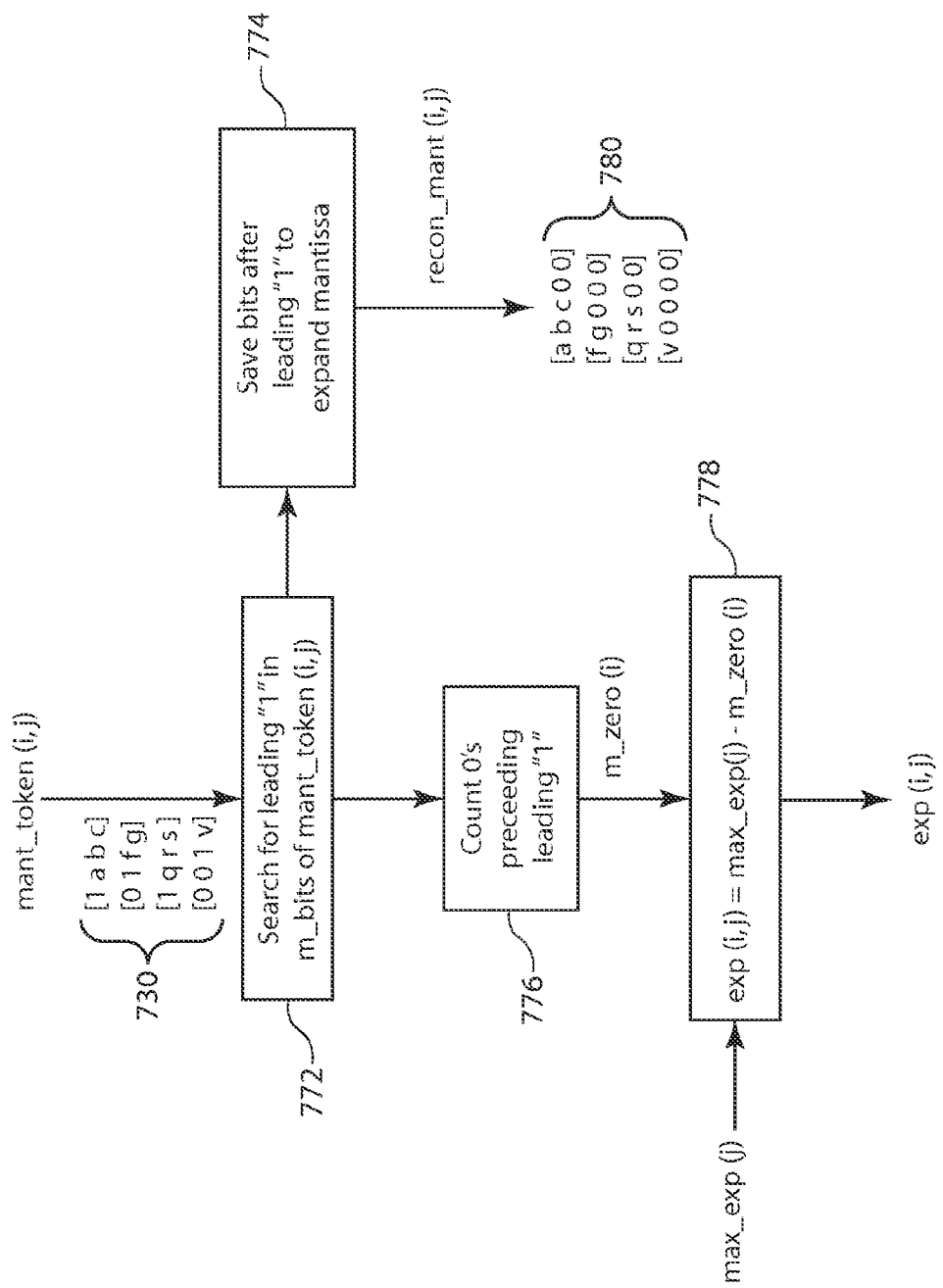
FIG. 25 is a block diagram of the decoder block 754 for the $j^{th}$ group of mantissas and exponents.

FIG. 25 is a block diagram of the decoder block 754 for the $j^{th}$ group of mantissas and exponents. In the mantissa tokens, mant_token(i,j), the position of the leading "1" indicates the binary place value relative to max_exp(j). This position can be used to determine the value of the corresponding exponent, exp(i,j), relative to max_exp(j). Block 722 searches for the position of the leading "1" in the mant_token(i,j). Since the leading "1" represents the hidden bit for the floating-point format described with respect to FIG. 1, it is not saved. Block 774 saves the bits after the leading "1" to the MSBs and fills in zeros in the (NM−m_bits) remaining bits of the reconstructed mantissa, recon_mant(i,j). For example for m_bits(j) =4 and NM=5, the group of reconstructed mantissas 780 are formed from the group of mantissa tokens 730. The reconstructed mantissas recon_mant(i,j) approximate the original mantissas mant(i,j). For the exponent values, block 776 counts the zeros m_zero(i) preceding the leading "1". Block 778 subtracts m_zero(i) from max_exp(j) to reconstruct the exponent, exp(i,j) to its original value.

To determine the number of mantissa bits, m_bits(j), as a function of the maximum exponent value block 702 (FIG. 22) and block 760 (FIG. 24) may use a look-up table or function block implementing the mapping function, as described above with respect to the fourth embodiment. However, block 702 and block 760 use the max_exp(j) to determine the number of mantissa bits m_bits(j) on group by group basis, rather than the sample by sample basis. Again, multiple mapping functions may be selectable as described above with respect to FIG. 20. Parameters for the mapping functions in graphs 652, 654, 656 and 658, may be determined based on the statistics of a set of floating-point numbers for the application to achieve a desired compression ratio for the mantissa bits. For example, a procedure for calculating the number of mantissa bits for the compressed mantissas uses the histogram for maximum exponents max_exp(j) and encoding groups of n_samp samples as follows, 1) Calculate a histogram of maximum exponent values max_exp(j) for encoding groups of n_samp samples in a set of N floating-point numbers for the application, where nmax_exp(x) is the number of max_exp(j)'s in $x^{th}$ histogram bin, where x represents a max_exp(j) value, 2) Set parameters for the mapping function mapMant(x) for x from minExp to maxExp (determined from the max_exp (j) histogram), for parameter such as minMant, maxMant, step heights and thresholds (graph 656), shape parameters (graphs 654 and 658), to construct a mapMant(x) that gives m_bits as a function of x, 3) Multiply the histogram values nmax_exp(x) times the corresponding m_bits values in mapMant(x) for x from minExp to maxExp, 4) Sum over the products in step 3 and multiply by n_samp to give the total number of compressed mantissa bits for the set of N floating-point numbers.

FIG. 26 gives examples of code tables for the maximum exponent differences, maxexp_diff(j). The code tables include exponent tokens, exp_token(j), for more frequent values maxexp_diff(j) in different ranges. For maxexp_diff(j) values outside this range, an escape (ESC) token is followed by the actual maxexp_diff(j), using the original number of exponent bits, NE. The exponent tokens may be Huffman codes whose token values are generated based on the frequency of occurrence of the maximum exponent differences, maxexp_diff(j). The exponent difference tables of FIG. 26 differ from those presented in FIG. 21 for the fourth embodiment because the probability distribution of the maximum exponent differences from group to group differs from the exponent differences from sample to sample. The maximum exponent differences, maxexp_diff(j), in the tables are arranged in frequency order from most frequent to least frequent, with more frequent exponent differences mapped to shorter tokens. The numbers of tokens are different, based on the different probability distributions. The examples in Tables 4, 5 and 6 are for illustrative purposes only. Other code tables could be generated based on the probability distribution of other maximum exponent difference values, maxexp_diff(j), and provide different exponent tokens, exp_token(j). Alternatively, the code tables may be generated by other entropy coding methods. In a preferred embodiment, multiple selectable code tables are generated in advance and stored in memory accessible to block 714 in FIG. 22. Block 714 may select the code table giving the most efficient representations for the maximum exponent values for the encoding groups in a set of floating-point numbers. Block 706 makes statistical measurements of the maximum exponent differences, maxexp_diff(j), to support table selection by block 714. For example, the number of bits used to represent the maximum exponent differences, maxexp_diff(j), for N floating-point numbers using a particular code table can be calculated as follows:

1) Calculate a histogram of maximum exponent difference values, maxexp_diff(j), for a set of N floating-point numbers, where nmaxDiff(z) is the number of maxexp_diff(j)'s in $z^{th}$ histogram bin, where z represents an maximum exponent difference value, 2) For each maximum exponent difference value z corresponding to an exponent token in the code table, multiply nmaxDiff(z) by the corresponding token length from the code table, 3) For the maximum exponent difference values z corresponding to "all others" in the code table, multiply nmaxDiff (z) by (ESC token length+NE), 4) Sum the products generated by steps 2) and 3) to give the total number of bits for encoding the maximum exponent differences, maxexp_diff(j), in the set of N floating-point numbers using the particular code table.

For the fifth embodiment, there is one exponent token exp_token(j) for every n_samp mantissas in the $j^{th}$ encoding group. The total number of bits to encode the maximum exponent differences, maxexp_diff(j), can be calculated for each of the selectable code tables. Block 714 may select the code table corresponding to the minimum number of bits as calculated above. The packetizer 716 stores the table indicator corresponding to the selected code table in the header section of the packet 740. Referring to FIG. 24, in a preferred embodiment, selectable code tables corresponding to those used for encoding are stored in memory accessible to block 750. Block 750 may use the table indicator extracted from the header of the received packet 740 to select the corresponding code table. The decoder block 752 matches the received exponent token, exp_token(j), with exponent tokens in the selected code table to determine corresponding maximum exponent difference, maxexp_diff(j).

The parameters for the above embodiments, such as the thresholds for the first, second and third embodiments and mantissa mapping function parameters and code table parameters for the fourth and fifth embodiments may be determined in advance on representative data sets for the application. Alternatively, the parameters may be determined using a set of floating-point numbers during a training interval during compression processing. The parameters may be updated to follow changing characteristics of the data. For example, the application may apply processing windows to the data, where data in a certain spatial or temporal interval are processed together. The parameters for the floating-point compression and decompression may be updated for each processing window.

Referring to FIG. 13 for the third embodiment, encoder blocks 514, 516 and 518 may apply aspects of the floating-point compression described with respect to the fourth and fifth embodiments to separately encode the signs, mantissas and exponents. For the different classes of floating-point numbers determined by the multiple exponent thresholds, the encoder blocks 514, 516 and 518 may apply different mapping functions to determine the number of mantissa bits m_bits (FIG. 18, block 602) or m_bits(j) (FIG. 22, block 702). Alternatively, the encoder blocks 514, 516 and 518 may instead use values for m_bits that depend on the indicator value for the class of the floating-point numbers, or m_bits ($B_0$). In this alternative, block 602 or block 702 may use $B_0$ determine m_bits=m_bits($B_0$) or m_bits(j)=m_bits($B_0$), so the mantissa tokens have m_bits($B_0$) bits. For exponent encoding, the selectable code tables (FIG. 18, block 614 and FIG. 22, block 714) may depend on the class of the floating-point number or the indicator value $B_0$. Similarly for decompression referring to FIG. 15, the decoder blocks 551, 552 and 553 may apply aspects of the floating-point decompression described with respect to the fourth and fifth embodiments to decode the sign tokens, mantissa tokens and exponent tokens. Depending on the mantissa compression applied for encoding, the decoder blocks 551, 552 and 553 may apply different mapping functions, depending on the values of the indicators $B_0$, to determine the number of mantissa bits m_bits (FIG. 19, block 640) or m_bits(j) (FIG. 24, block 760). For the alternative where the number of mantissa bits depends on the indicator value $B_0$, blocks 640 and 760 may provide m_bits($B_0$) for extracting and expanding the mantissa tokens. For exponent decoding, the code tables selectable at block 714 (FIG. 22) or block 750 (FIG. 24) may depend on the indicator value $B_0$.

The compression type may be selectable. For example, for different floating-point formats, i.e. single precision and double precision, the type of compression applied by the encoders described above may be selected based on the floating-point format. In many applications and particularly for software implementations, the floating-point data format is known. A compression type parameter based on the floating-point format may transfer control of program execution to the appropriate compression instructions in accordance with the compression control parameter. The compression type may be selected based on the complexity of the compression operations. For example, the encoders may apply alternative compression that has lower computational requirements, such as the first, second, or third embodiments, for lower computational load or lower processing time.

A variety of implementation alternatives exist for the embodiments of the floating-point compressors and decompressors. The implementations can include logic to perform the processes described herein, where the logic can include dedicated logic circuits, configurable logic such as field programmable logic array FPGA blocks, configured to perform the functions, general purpose processors or digital signal processors that are programmed to perform the functions, and various combinations thereof. The above-referenced '312 application describes configurable compressors/decompressors where configurable for integer or floating-point data compression are implemented in a multi-core processing system. The floating-point compression and decompression techniques described herein may be implemented in the configurable compressors and decompressors, described in the '312 application, when configured to compress/decompress floating-point data.

The floating-point compression and decompression operations can be implemented in hardware, software or a combination of both and incorporated in computing systems, such as those described in FIGS. 2 to 6. The hardware implementations include ASIC, FPGA or an intellectual property (IP) block. The floating-point compression and decompression operations can be implemented in software or firmware on a programmable processor, such as a digital signal processor (DSP), microprocessor, microcontroller, multi-core CPU, or GPU. The compressed data packets may be provided for data transfer of compressed floating-point data between components of a data processing system or computer system, such as between the data processor and memory, between multiple processor cores, between memories of the data processing system. The compressed data packets may also provide for data transfer of compressed floating-point data over a communication channel or network to storage devices, computer readable media or to another data processing system.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. A sensor processing system comprising:
    a sensor subsystem detecting a physical signal and outputting an analog signal representing the physical signal;
    an analog-to-digital converter (ADC) circuit for converting the analog signal to digital signal samples; and
    an application processor receiving the digital signal samples, representing the digital signal samples as floating-point numbers, and compressing the floating-point numbers, wherein each floating-point number includes an original number of bits in accordance with a floating-point format used in the application processor, the floating-point format defining a sign bit to represent a sign, a plurality of exponent bits to represent an exponent and a plurality of mantissa bits to represent a mantissa, wherein said compressing uses a method comprising:
    setting a plurality of exponent thresholds in a memory of the application processor;
    assigning memory to an indicator array to store a plurality of M indicators for a group of M floating-point numbers;
    providing a plurality of compression types;
    for each of the M floating-point numbers, comparing the exponent of the floating-point number to at least one of the exponent thresholds to determine a corresponding class from the plurality of classes;

setting the indicator for a corresponding position in the indicator array to the indicator value associated with the corresponding class;

encoding the floating-point number in accordance with the compression type for the corresponding class to form an encoded floating-point number; and storing the M indicator values of the indicator array and up to M encoded floating-point numbers in a compressed data packet.

2. The sensor processing system of claim 1, wherein one of the compression types specifies bypassing said encoding for the associated class where the floating-point numbers have exponent values less than or equal to a lowest exponent threshold of the plurality of exponent thresholds.

3. The sensor processing system of claim 1, wherein one of the compression types specifies using the floating-point format for the associated class, wherein said encoding provides the floating-point number having the original number of bits in accordance with the floating-point format as the encoded floating-point number.

4. The sensor processing system of claim 1, wherein one of the compression types specifies compression of the mantissa for the associated class, said encoding further comprising:

compressing the mantissa of the floating-point number to form a compressed mantissa having a reduced number of mantissa bits, wherein the encoded floating-point number is represented by the sign bit, the plurality of exponent bits and the compressed mantissa.

5. The sensor processing system of claim 4, wherein the compression type specifies a number of bits per compressed sample for the corresponding class, wherein the reduced number of mantissa bits, the plurality of exponent bits and the sign bit provide the number of bits per compressed sample.

6. The sensor processing system of claim 4, wherein said compressing the mantissa further comprises removing a number of mantissa bits from least significant bit positions of the mantissa to form the compressed mantissa.

7. The sensor processing system of claim 4, wherein at least one of the exponent thresholds is based on the reduced number of mantissa bits for mantissas in the associated class.

8. The sensor processing system of claim 1, wherein one of the compression types specifies compression of the mantissa and the exponent for the associated class, said encoding further comprising:

compressing the mantissa to a reduced number of mantissa bits to form a mantissa token;

compressing the exponent to form an exponent token; and using the sign bit for a sign token, wherein the mantissa token, the exponent token and the sign token provide the encoded floating-point number for the compressed data packet.

9. The sensor processing system of claim 1, wherein one of the compression types specifies compression of the mantissa, the exponent and the sign for the associated class, said encoding further comprising:

compressing the mantissa to a reduced number of mantissa bits to form a mantissa token;

compressing the exponent to form an exponent token; and compressing the signs of the up to M floating-point numbers to form one or more sign tokens, wherein said storing step, the mantissa tokens, exponent tokens and sign tokens provide the up to M encoded floating-point numbers for the compressed data packet.

10. The sensor processing system of claim 1, wherein the exponent thresholds have successively higher threshold values to define boundaries of respective ranges of exponent values corresponding to a plurality of classes for the floating-point numbers, wherein a position of an indicator in the indicator array corresponds to one of the floating-point numbers, wherein an indicator value is associated with the class of the floating-point number, wherein a particular compression type is associated with a particular class of floating-point numbers and a particular indicator value, and wherein at least one of the exponent thresholds is based on a desired compression ratio.

11. A method for compressing sensor data by an application processor that receives digital signal samples of an analog signal from a physical measurement and represents the digital signal samples as floating-point numbers, wherein each floating-point number consists of an original number of bits in accordance with a floating-point format used in the application processor, the floating-point format defining a sign bit to represent a sign, a plurality of exponent bits to represent an exponent and a plurality of mantissa bits to represent a mantissa, the method comprising:

setting an exponent threshold in memory of the application processor;

assigning memory to an indicator array to store a plurality of M indicators for M floating-point numbers;

for each of the M floating-point numbers, comparing the exponent of the floating-point number to the exponent threshold;

when the exponent is greater than the exponent threshold, setting the indicator for a corresponding position in the indicator array to a first indicator value;

encoding the floating-point number to form an encoded floating-point number;

storing the encoded floating-point number in a compressed data packet;

otherwise when the exponent is less than or equal to the exponent threshold, setting the indicator for the corresponding position in the indicator array to a second indicator value; and storing the indicator array in the compressed data packet.

12. The method of claim 11, wherein said encoding provides the floating-point number having the original number of bits in accordance with the floating-point format as the encoded floating-point number.

13. The method of claim 11, wherein a position of the indicator in the indicator array corresponds to one of the M floating-point numbers, and wherein the exponent threshold is based on a desired compression ratio.

14. The method of claim 11, further comprising decompressing the compressed data packet, the decompressing further comprising:

extracting the indicator array from the compressed data packet;

for each of the M indicators, testing whether the indicator equals the first indicator value or the second indicator value;

when the indicator equals the first indicator value, decoding the encoded floating-point number from the compressed data packet corresponding to the indicator to form a reconstructed floating-point number in the floating-point format; and when the indicator equals the second indicator value, providing a fill value in the floating-point format for the reconstructed floating-point number.

15. The method of claim 14, wherein the step of decoding further comprises:
providing the encoded floating-point number as the reconstructed floating-point number in accordance with the first indicator value when the encoded floating-point number is represented in the floating-point format.

16. A system for processing sensor data, the system comprising:
a data processor that receives digital signal samples of an analog signal representing a physical measurement by a sensor, represents the digital signal samples as floating-point numbers, and processes the floating-point numbers, wherein a floating-point number includes an original number of bits in accordance with a floating-point format used in the data processing system, the floating-point format defining a sign bit to represent a sign, a plurality of exponent bits to represent an exponent and a plurality of mantissa bits to represent a mantissa, the data processor providing a group of M floating-point numbers;
a plurality of exponent thresholds set in a memory accessible by the data processor;
an indicator array set in the memory to include a plurality of M indicators for the M floating-point numbers; and
compression logic, configurable for a plurality of compression types, applied to the M floating-point numbers, the compression logic including:
logic to compare the exponent of each of the M floating-point numbers to at least one of the exponent thresholds to determine a corresponding class from the plurality of classes and to set the indicator for a corresponding position in the indicator array to the indicator value associated with the corresponding class;
an encoder applied to the floating-point number in accordance with the compression type for the corresponding class to form an encoded floating-point number; and
packing logic to store the M indicator values of the indicator array and up to M encoded floating-point numbers in a compressed data packet.

17. The system of claim 16, wherein one of the compression types specifies bypassing the encoder for the associated class where the floating-point numbers have exponent values less than or equal to a lowest exponent threshold of the plurality of exponent thresholds.

18. The system of claim 16, wherein one of the compression types specifies using the floating-point format for the associated class, wherein the encoder provides the floating-point number having the original number of bits in accordance with the floating-point format as the encoded floating-point number to the packing logic.

19. The system of claim 16, wherein one of the compression types specifies compression of the mantissa for the associated class, the encoder further comprising:
logic to compress the mantissa of the floating-point number to form a compressed mantissa having a reduced number of mantissa bits, wherein the encoded floating-point number is represented by the sign bit, the plurality of exponent bits and the compressed mantissa.

20. The system of claim 19, wherein the compression type specifies a number of bits per compressed sample for the corresponding class, wherein the reduced number of mantissa bits, the plurality of exponent bits and the sign bit provide the number of bits per compressed sample.

21. The system of claim 19, wherein the logic to compress the mantissa removes a number of mantissa bits from least significant bit positions of the mantissa to form the compressed mantissa.

22. The system of claim 19, wherein at least one of the exponent thresholds is based on the reduced number of mantissa bits for mantissas in the associated class.

23. The system of claim 16, wherein one of the compression types specifies compression of the mantissa and the exponent for the associated class, the encoder further comprising:
logic to compress the mantissa to a reduced number of mantissa bits to form a mantissa token; and
logic to compress the exponent to form an exponent token, wherein the encoder provides the sign bit, the mantissa token and the exponent token as the encoded floating-point number to the packing logic for the compressed data packet.

24. The system of claim 16, wherein one of the compression types specifies compression of the mantissa, the exponent and the sign for the associated class, the encoder further comprising:
logic to compress the mantissa to a reduced number of mantissa bits to form a mantissa token;
logic to compress the exponent to form an exponent token; and
logic to compress the signs of up to M floating-point numbers to form one or more sign tokens, wherein the packing logic stores the mantissa tokens, the exponent tokens and the sign tokens for the up to M floating-point numbers to the compressed data packet.

25. The system of claim 16,
wherein the exponent thresholds have successively higher threshold values to define boundaries of respective ranges of exponent values corresponding to a plurality of classes for the floating-point numbers,
wherein a position of an indicator in the indicator array corresponds to one of the floating-point numbers, wherein an indicator value is associated with the class of the floating-point number,
wherein a particular compression type is associated with a particular class of floating-point numbers and a particular indicator value, and
wherein at least one of the exponent thresholds is based on a desired compression ratio.

26. A data processing system, comprising:
a data processor that processes floating-point numbers, wherein each floating-point number consists of an original number of bits in accordance with a floating-point format used in the data processing system, the floating-point format defining a sign bit to represent a sign, a plurality of exponent bits to represent an exponent and a plurality of mantissa bits to represent a mantissa, the data processor providing a group of M floating-point numbers;
an exponent threshold set in a memory accessible by the data processor;
an indicator array set in the memory to store a plurality of M indicators for the M floating-point numbers, wherein a position of the indicator in the indicator array corresponds to one of the M floating-point numbers;
compression logic applied to the M floating-point numbers, including:
logic to compare the exponent of each of the M floating-point numbers to the exponent threshold and to set the indicator for a corresponding position in the indicator array to a first indicator value when the exponent is greater than the exponent threshold or to a second indicator value when the exponent is less than or equal to the exponent threshold;

an encoder applied to the floating-point number in to form an encoded floating-point number when the corresponding indicator is set to the first indicator value; and packing logic to store the M indicator values of the indicator array in a compressed data packet and to store up to M encoded floating-point numbers corresponding to the indicators set to the first indicator value in the compressed data packet.

27. The data processing system of claim 26, the encoder provides the floating-point number having the original number of bits in accordance with the floating-point format as the encoded floating-point number to the packing logic.

28. The data processing system of claim 26, wherein the exponent threshold is based on a desired compression ratio.

29. The data processing system of claim 26, further comprising decompression logic receiving the compressed data packet and providing reconstructed floating-point numbers to the data processor, the decompression logic comprising:

logic to extract the indicator array from the compressed data packet;

logic to determine whether the indicator equals the first indicator value or the second indicator value;

a decoder to decode the encoded floating-point number from the compressed data packet corresponding to the indicators having the first indicator value to form a reconstructed floating-point number in the floating-point format and to provide a fill value in the floating-point format for the reconstructed floating-point number corresponding to the indicators having the second indicator value.

30. The data processing system of claim 29, wherein the decoder provides the encoded floating-point number as the reconstructed floating-point number in accordance with the first indicator value when the encoded floating-point number is represented in the floating-point format.

* * * * *